US008648951B2

(12) United States Patent  
Mabuchi et al.

(10) Patent No.: US 8,648,951 B2  
(45) Date of Patent: *Feb. 11, 2014

(54) SEMICONDUCTOR MODULE, MOS TYPE SOLID-STATE IMAGE PICKUP DEVICE, CAMERA AND MANUFACTURING METHOD OF CAMERA

(71) Applicants: Keiji Mabuchi, Kanagawa (JP); Shunichi Urasaki, Kanagawa (JP)

(72) Inventors: Keiji Mabuchi, Kanagawa (JP); Shunichi Urasaki, Kanagawa (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/947,862

(22) Filed: Jul. 22, 2013

(65) Prior Publication Data

US 2013/0300905 A1    Nov. 14, 2013

Related U.S. Application Data

(63) Continuation of application No. 11/179,991, filed on Jul. 12, 2005, now Pat. No. 8,508,639.

(30) Foreign Application Priority Data

Jul. 30, 2004    (JP) ................................. P2004-224208

(51) Int. Cl.  
*H04N 3/14*    (2006.01)  
*H04N 5/335*   (2011.01)

(52) U.S. Cl.  
USPC ........... 348/308; 348/294; 348/300; 348/301; 250/370.01; 250/370.08; 250/370.14

(58) Field of Classification Search  
USPC .......... 348/340, 308, 294, 300, 301; 257/292, 257/204, 208, 685, 686, 730; 250/214.1, 250/370.01, 370.08, 370.14  
See application file for complete search history.

(56) References Cited

U.S. PATENT DOCUMENTS

| | | | |
|---|---|---|---|
| 6,858,941 B2 * | 2/2005 | Ference et al. | 257/781 |
| 7,372,135 B2 * | 5/2008 | Chao et al. | 257/678 |
| 7,824,961 B2 * | 11/2010 | Adkisson et al. | 438/109 |
| 2004/0212719 A1 * | 10/2004 | Ikeda | 348/340 |
| 2006/0043568 A1 * | 3/2006 | Abe et al. | 257/698 |
| 2007/0257356 A1 * | 11/2007 | Abe et al. | 257/700 |
| 2008/0173903 A1 * | 7/2008 | Imai et al. | 257/231 |

* cited by examiner

*Primary Examiner* — Antoinette Spinks  
(74) *Attorney, Agent, or Firm* — Sheridan Ross P.C.

(57) ABSTRACT

A back-illuminated type MOS (metal-oxide semiconductor) solid-state image pickup device in which micro pads are formed on the wiring layer side and a signal processing chip having micro pads formed on the wiring layer at the positions corresponding to the micro pads of the MOS solid-state image pickup device are connected by micro bumps. In a semiconductor module including the MOS type solid-state image pickup device, at the same time an image processing speed can be increased, simultaneity within the picture can be realized and image quality can be improved, a manufacturing process can be facilitated, and a yield can be improved. Also, it becomes possible to decrease a power consumption required when all pixels or a large number of pixels is driven at the same time.

20 Claims, 13 Drawing Sheets

SEMICONDUCTOR MODULE, MOS TYPE SOLID-STATE IMAGE PICKUP DEVICE, CAMERA AND MANUFACTURING METHOD OF CAMERA

CROSS REFERENCES TO RELATED APPLICATIONS

This application is a continuation of U.S. patent application Ser. No. 11/179,991 filed Jul. 12, 2005, which claims the benefit of Japanese Patent Application No. 2004-224208 filed on Jul. 30, 2004, the entire contents of each of which are hereby incorporated by reference.

BACKGROUND OF THE INVENTION

1. Field of the Invention

The present invention relates to a semiconductor module including a MOS (metal-oxide semiconductor) type solid-state image pickup device, a MOS type solid-state image pickup device, a camera and a method of manufacturing a camera.

2. Description of the Related Art

So far a MOS camera module, for example, is known as a semiconductor module including a MOS type solid-state image pickup device. In order to manufacture a small MOS camera module, there is a promising method of overlaying a MOS type solid-state image pickup device (hereinafter referred to as an "MOS image sensor chip") and a signal processing chip with each other.

As a MOS camera module according to the related-art example 1, there is known a SIP (system in package) arrangement which is described in a non-patent reference 1, for example. In this MOS camera module, a MOS image sensor chip is overlaid over and bonded to a signal processing chip, the MOS image sensor chip and the signal processing chip are disposed on a circuit board, the two chips and the circuit board are treated by a wire bonding process and then the MOS image sensor chip and the signal processing chip are interconnected with each other by this wiring bonding process.

FIG. 1 of the accompanying drawings is a schematic diagram showing an arrangement of a MOS image sensor chip according to the related art. As shown in FIG. 1, this MOS image sensor chip 1 includes a pixel portion 2 in which a plurality of pixels 3 is arrayed in a two-dimensional fashion (that is, an XY matrix fashion), a column portion 4, an output circuit 6 connected to a horizontal signal line 5, a vertical driving circuit 7, a horizontal driving circuit 8 and a control circuit 9.

The control circuit 9 is supplied with an input clock and data for instructing operation modes from the outside of the MOS image sensor 1. In response to these input clock and data, the control circuit 9 supplies clocks and pulses to the following respective portions so that the respective portions may become to operate.

The vertical driving circuit 7 selects a row of the pixel portion 2 and a necessary pulse is supplied to the pixels of the selected row through a control wiring extended in the lateral direction, although not shown.

The column portion 4 has column signal processing circuits arrayed corresponding to the columns. The column signal processing circuit 10 is supplied with a pixel signal of one line amount and processes the thus supplied signal in a suitable processing fashion such as a CDS (Correlated Double Sampling: processing for eliminating a fixed pattern noise), a signal amplification and an A/D (analog-to-digital) conversion.

The horizontal driving circuit 8 selects the column signal processing circuits 10 sequentially and supplies signals of the column signal processing circuits 10 to the horizontal signal line 5. The output circuit 6 processes the signal from the horizontal line 5 and outputs the thus processed signal. For example, the processing done by the output circuit 6 may be a variety of processing such as only buffering or black level adjustment, correction of column scattering, signal amplification, color processing prior to the buffering.

FIG. 2 is a circuit diagram showing an example of a pixel circuit in the MOS image sensor 1 shown in FIG. 1. In this example, four pixels constitute one cell.

As shown in FIG. 2, this pixel circuit includes four photodiodes PD [PD1, PD2, PD3, PD4] serving as photoelectric-converting elements. The photodiodes PD1 to PD4 are connected to corresponding four transfer transistors 12 [121, 122, 123, 124], respectively. Transfer wirings 161 to 164 are connected to the gates of the respective transfer transistors 121 to 124. The drains of the respective transfer transistors 121 to 124 are connected to be common, which is then connected to the source of a reset transistor 13. A so-called floating diffusion FD between the drain of the transfer transistor 12 and the source of a reset transistor 13 is connected to the gate of an amplifying transistor 14. The drain of the reset transistor 13 is connected to a power supply wiring 15 and the gate thereof is connected to a reset wiring 17. Also, there is provided a selection transistor 18 whose drain is connected to the power supply wiring 15. The source of the selection transistor 18 is connected to the drain of the amplifying transistor 14. A selection wiring 19 is connected to the gate of the selection transistor 18. The photodiodes PD [PD1 to PD4], the transfer transistors 12 [121 to 124], the reset transistor 13, the selection transistor 18 and the amplifying transistor 14 constitute one cell which results from collecting four pixels (photodiodes). On the other hand, the source of the amplifying transistor 14 is connected to the vertical signal line 21. A load transistor 22 whose drain is connected to the vertical signal line 21 and which may serve as a constant current source, which will be described later on, is connected to the vertical signal line 21 as a part of the column signal processing circuit 10. A load wiring 23 is connected to the gate of the load transistor 22.

In this pixel circuit, signal electrical charges are photoelectrically converted by the four photodiodes PD [PD1 to PD4]. Photoelectrons (signal electrical charges) of the photodiodes PD are transferred through the corresponding transfer transistors 12 [121 to 124] to the floating diffusion FD. Since the floating diffusion FD is connected to the gate of the amplifying transistor 14, if the selection transistor 18 is turned ON, then a signal corresponding to an electrical potential of the floating diffusion FD is output through the amplifying transistor 14 to the vertical signal line 21.

The reset transistor 13 discards the signal electrical charges (electrons) of the floating diffusion FD to the power supply line 15 to reset signal electrical charges of the floating diffusion FD. Lateral direction wirings 19, 17 and 16 [161 to 164] are made common to the pixels of the same row and are thereby controlled by the vertical driving circuit 7.

The load transistor 22, which serves as a constant current source, is provided at a part of the column signal circuit 10. The load transistor 22 and the amplifying transistor 14 of the selected row constitute a source follower to supply its output to the vertical signal line 21.

As a CMOS (complementary metal-oxide semiconductor) image sensor module according to a related-art example 2, there is known such one which is described in a cited non-patent reference 2. In this example, an image sensor chip has a substrate through which wirings are passed and the image sensor is connected to a lower-side chip by using micro bumps. According to this method, because the number of bumps can be increased and an inductance and a capacitor component can be decreased, a high-speed interface becomes possible. Further, the image sensor chip is directly connected to the lower-side chip through the wirings from the pixel portion, whereby simultaneity within the picture can also be obtained.

[Non-patent reference 1]: Sharp technical journal Volume 81, 2001, December, page 34
[Non-patent reference 2]: IEDM 99, pp. 879-882

SUMMARY OF THE INVENTION

In the method of manufacturing a MOS camera module according to the related-art example 1, when the MOS image sensor chip is generally several millimeters square, the output from the MOS image sensor is supplied to the signal processing chip through several 10s of bonding wires at best, which becomes a bottleneck to hinder an increase of an image processing speed. The reason why this image processing speed is limited is that the number of wire bonding may not be increased and that a signal is disturbed and delayed due to an inductance of bonding wires and a capacitor component produced between the bonding wires or between the bonding wires and the circuit substrate.

Also, since it is customary for this type of MOS camera module to read out signals from the pixels of the pixel portion in the sequential order of rows, pixel signals are read out from the upper pixels and the lower pixels of the pixel portion at different times so that simultaneity within the picture may not be established. Alternatively, if exposure timings within the picture are made uniform, then noises are superimposed upon the pixel signals until the pixel signals are read out from the pixels, thereby resulting in picture quality being deteriorated.

In the CMOS image sensor module according to the related-art example 2, an increase in the cost of the process for enabling wirings to be passed through the substrate and a decrease in a yield are serious. In addition, a problem in which an aperture ratio of a pixel is decreased due to a pixel circuit is similar to that in related art. In particular, because regions through which wirings can be penetrated should be maintained in the silicon (Si) substrate, it is unavoidable that a useless area will be increased from an optics standpoint. For example, in this example, a through-hole is 2.5 μm in diameter and a margin area should be prepared around such through-hole so that an area with a diameter of approximately 3 μm becomes useless. Further, a process for forming a through-hole is required and hence a process becomes complicated so that a manufacturing process becomes complex. In this related-art example, a pixel circuit is not presented. What is to be experimented in this related-art example is a structure in which only photodiodes are formed on an upper wafer, an optical current being caused to flow into a lower wafer as it is.

In view of the above-described aspects, the present invention provides a semiconductor module in which a manufacturing process can be facilitated and a yield can be increased while an image processing speed can be increased, simultaneity within a picture can be realized and image quality can be improved.

Further, the present invention provides a semiconductor module in which an electric current consumed when all pixels or a large number of pixels are driven simultaneously can be controlled.

Further, the present invention provides a MOS type solid-state image pickup device which may be applied to the semiconductor module and the like.

Furthermore, the present invention intends to provide a camera including a MOS type solid-state image pickup device and a semiconductor module and a manufacturing method of a camera.

According to an embodiment of the present invention, a semiconductor module includes a back-illuminated type MOS type solid-state image pickup device in which micro pads are formed on a wiring layer side at every unit pixel cell or at every cell of a plurality of pixels and a signal processing chip in which micro pads are formed on a wiring layer side at positions corresponding to the micro pads of the MOS solid-state image pickup device, wherein the MOS type solid-state image pickup device and the signal processing chip are connected by micro bumps.

According to an embodiment of the present invention, in the above-described semiconductor module, pixel driving micro pads are formed on a region corresponding to the periphery of the pixel region portion of the MOS type solid-state image pickup device, the pixel driving micro pads being connected to the micro pads of the signal processing chip side through the micro bumps.

Further, the semiconductor module has an external interface established only through ordinary pads of the signal processing chip. That is, the semiconductor module does not have an external interface established from the MOS type solid-state image pickup device.

Furthermore, the MOS type solid-state image pickup device includes ordinary test pads.

According to an embodiment of the present invention, in the above-described semiconductor module, the MOS type solid-state image pickup device has a cell including: a photoelectric-converting element, an amplifying transistor including the gate to receive signal electrical charges from the photoelectric-converting element, an output line directly or indirectly connected to the source of the amplifying transistor so as to be connected to the micro pads, a load transistor of which drain is directly or indirectly connected to the output line, a wiring connected to the source of the load transistor to supply a first voltage, a reset mechanism for resetting a gate potential of the amplifying transistor and a wiring directly or indirectly connected to the drain of the amplifying transistor to supply a second voltage.

According to an embodiment of the present invention, in the above-described semiconductor module, the MOS type solid-state image pickup device has a cell including: a photoelectric-converting element, an amplifying transistor including the gate to receive signal electrical charges from the photoelectric-converting element, an output line directly or indirectly connected to the source of the amplifying transistor, an injection transistor of which drain is directly or indirectly connected to said output line, a wiring connected to the source of the injection transistor to supply a first voltage, a reset mechanism for resetting a gate potential of the amplifying transistor, an activation transistor of which source is directly or indirectly connected to the drain of the amplifying transistor and a wiring directly or indirectly connected to the drain of the activation transistor to supply a second voltage.

According to an embodiment of the present invention, in the above-described semiconductor module, the reset mechanism is supplied with a reset pulse, the reset pulse overlapping with a first injection pulse supplied to the injection transistor and the reset pulse being ended before the end of the first injection pulse.

Further, the cell further includes a transfer transistor of which source is connected to the photoelectric-converting element and whose drain is directly or indirectly connected to the gate of the amplifying transistor, a transfer pulse supplied to the transfer transistor being ended before the start of a second injection pulse supplied to the injection transistor.

According to an embodiment of the present invention, in the above-described semiconductor module, the MOS type solid-state image pickup device outputs a cell output which is a multiplexed analog signal, the analog signal being multiplexed and stored in a memory after digitized by the signal processing chip.

According to an embodiment of the present invention, in the above-described semiconductor module, the MOS type solid-state image pickup device outputs a cell output which is a digital signal, the digital signal being demultiplexed and stored in a memory by the signal processing chip.

Further, the cell output is an output resulting from further multiplexing a pixel signal after the pixel signal was analog-to-digital converted.

Furthermore, according to an embodiment of the present invention, the MOS solid-state image pickup device may not include a control circuit.

According to another embodiment of the present invention, a MOS type solid-state image pickup device has a unit pixel cell or a cell having a plurality of pixels, including a photoelectric-converting element, an amplifying transistor including the gate to receive signal electrical charges from the photoelectric-converting element, an output line directly or indirectly connected to the source of the amplifying transistor, an injection transistor of which drains is directly or indirectly connected to the output line, a wiring connected to the source of the injection transistor to supply a first voltage, a reset mechanism for resetting a gate potential of the amplifying transistor, an activation transistor of which source is directly or indirectly connected to the drain of the amplifying transistor and a wiring directly or indirectly connected to the drain of the activation transistor to supply a second voltage.

This MOS type solid-state image pickup device may be applied to both of a back-illuminated type solid-state image pickup device and a front-illuminated type solid-state image pickup device. Also, this MOS type solid-state image pickup device may be applied to solid-state image pickup device regardless of the presence or absence of micro bumps.

According to another embodiment of the present invention, in the above-described MOS type solid state image pickup device, the reset pulse supplied to the reset mechanism overlaps with a first injection pulse supplied to the injection transistor, the reset pulse being ended before the first injection pulse is ended.

Further, the cell further includes a transfer transistor the source of which is connected to the photoelectric-converting element and the drain of which is directly or indirectly connected to the gate of an amplifying transistor, a transfer pulse supplied to said transfer transistor being ended before a second injection pulse supplied to the injection transistor being started.

According to a further embodiment of the present invention, a camera includes a semiconductor module in which a back-illuminated type MOS (metal-oxide semiconductor) type solid-state image pickup device in which micro pads formed on a wiring layer side at every unit pixel cell or at every cell of a plurality of pixels and a signal processing chip in which micro pads are formed on a wiring layer side at positions corresponding to the micro pads of the MOS solid-state image pickup device, wherein the MOS solid-state image pickup device and the signal processing chip are connected by micro bumps.

According to further embodiment of the present invention, in the above-described camera, pixel driving micro pads are formed on a region corresponding to the periphery of the pixel region portion of the MOS solid-state image pickup device, the pixel driving micro pads being connected to the micro pads of the signal processing chip side through the micro bumps.

According to further embodiment of the present invention, in the above-described camera, the semiconductor module has an external interface established through ordinary pads of the signal processing chip.

Further, according to further embodiment of the present invention, in the above-described camera, the MOS solid-state image pickup device has a cell including a photoelectric-converting element, an amplifying transistor including the gate to receive signal electrical charges from the photoelectric-converting element, an output line directly or indirectly connected to the source of the amplifying transistor so as to be connected to the micro pads, a load transistor of which drain is directly or indirectly connected to the output line, a wiring connected to the source of the load transistor to supply a first voltage, a reset mechanism for resetting a gate potential of the amplifying transistor and a wiring directly or indirectly connected to the drain of the amplifying transistor to supply a second voltage.

Furthermore, according to still further embodiment of the present invention, a manufacturing method of camera includes: a process for forming micro pads on a wiring layer side at every unit pixel or at every cell of a plurality of pixels in a back-illuminated type MOS solid-state image pickup device and a process for connecting the back-illuminated MOS solid-state image pickup device and a signal processing chip having micro pads formed on a wiring layer side at the positions corresponding to the micro pads of the MOS type solid-state image pickup device through micro bumps.

According to the embodiment of the semiconductor module of the present invention, since this semiconductor module includes a back-illuminated type MOS solid-state image pickup device in which micro pads are formed on a wiring layer side at every unit pixel cell or at every cell of a plurality of pixels and a signal processing chip in which micro pads are formed on a wiring layer side at positions corresponding to the micro pads of the MOS type solid-state image pickup device, wherein the MOS type solid-state image pickup device and the signal processing chip are connected by micro bumps, an image processing speed can be increased and therefore a high-speed interface becomes possible. Also, since all pixels or a large number of pixels can be driven at the same time and pixel signals can be read out at the same time, simultaneity within the picture can be obtained. Accordingly, it is possible to obtain excellent picture quality.

Since the semiconductor module employs the back-illuminated MOS type solid-state image pickup device in which the micro pads are formed on the wiring layer side at its surface opposite to the light incident surface, a large number of micro pads can be arrayed on the surface without consciousness of the aperture ratio of the image sensor.

Only the pixels and the wirings may be formed on the side of the MOS type solid-state image pickup device and all of other circuit systems than the pixels and the wiring are formed on the side of the signal processing chip. With this arrangement, it is possible to decrease the costs of both the MOS type solid-state image pickup device and the signal processing chip.

Since the MOS type solid-state image pickup device is formed as a back-illuminated MOS type solid-state image pickup device and the solid-state image pickup device and the signal processing chip are connected at the wiring layer sides through the micro pads and the micro bumps, a related-art through-hole forming process is not required and hence the number of processes can be decreased. Thus, a manufacturing process can be facilitated and a yield can be increased. As a result, since the photosensitive region is not decreased with the space to prepare the through-holes, sensitivity of the MOS type solid-state image pickup device can be improved and hence asymmetry against skewed light can be prevented.

The so-called pixel driving micro pads such as those for use as a power supply, a ground and a pixel control signal are formed on the MOS type solid-state image pickup device at its region corresponding to the periphery of the pixel region portion and the micro pads can be connected to the micro pad of the signal processing chip side through the micro bumps. Hence, an inductance and a capacity component between the connected portions can be decreased and disturbance and delay of a signal can be avoided.

Since the external interface is established only through the ordinary pad of the signal processing chip, that is, the external interface is not established from the MOS type solid-state image pickup device side, an optically useless area on the MOS type solid-state image pickup device side can be omitted and hence it is possible to avoid the decrease in the ratio at which the pixel areas are occupied by the circuit system.

Since the MOS type solid-state image pickup device includes the ordinary pad for testing, characteristics of the MOS type solid-state image pickup device can be inspected before it is bonded to the signal processing chip.

Since the MOS type solid-state image pickup device has a cell including: a photoelectric-converting element, an amplifying transistor including the gate to receive signal electrical charges from the photoelectric-converting element, an output line directly or indirectly connected to the source of the amplifying transistor so as to be connected to the micro pads, a load transistor of which drain is directly or indirectly connected to the output line, a wiring connected to the source of the load transistor to supply a first voltage, a reset mechanism for resetting a gate potential of the amplifying transistor and a wiring directly or indirectly connected to the drain of the amplifying transistor to supply a second voltage, the MOS type solid-state image pickup device and the signal processing chip can be connected through the above-mentioned micro bumps, all pixels or a large number of pixels can be driven at the same time and pixels signals can be read out at the same time.

Since the MOS type solid-state image pickup device has a cell including a photoelectric-converting element, an amplifying transistor including the gate to receive signal electrical charges from the photoelectric-converting element, an output line directly or indirectly connected to the source of the amplifying transistor, an injection transistor of which drain is directly or indirectly connected to the output line, a wiring connected to the source of the injection transistor to supply a first voltage, a reset mechanism for resetting a gate potential of the amplifying transistor, an activation transistor of which source is directly or indirectly connected to the drain of the amplifying transistor and a wiring directly or indirectly connected to the drain of the activation transistor to supply a second voltage, the MOS type solid-state image pickup device and the signal processing chip can be connected through the above-mentioned micro bumps, all pixels or a large number of pixels can be driven at the same time and pixels signals can be read out at the same time. Further, the cell includes the activation transistor and the injection transistor and both of the activation transistor and the injection transistor can be prevented from being turned on at the same time so that a constant electric current can be prevented from flowing and the MOS type solid-state image pickup device includes the cells of the order of 1,000,000. Thus, when all pixels or a large number of pixels can be driven at the same time and pixels signals can be read out at the same time, a large electric current can be prevented from flowing and hence a problem of an electric current can be solved.

Since the reset mechanism is supplied with a reset pulse, the reset pulse overlapping with a first injection pulse supplied to the injection transistor and the reset pulse being ended before the end of the first injection pulse, the output line electrical potential obtained immediately after the reset pulse can be made equal to the ground electrical potential and hence the output line electrical potential can be prevented from being fluctuated.

Since the cell includes the transfer transistor and the transfer pulse supplied to the transfer transistor is ended before the second injection pulse supplied to the injection transistor is started, the voltage can be lowered. That is, as compared with the case in which the transfer pulse overlaps with the second injection pulse, the electrical potential obtained from the floating diffusion (FD) upon transfer is high owing to the effectiveness of the capacity coupling within the pixel so that the voltage can be lowered.

Since the MOS type solid-state image pickup device outputs a cell output which is a multiplexed analog signal, the analog signal is digitized by the signal processing chip, demultiplexed and stored in the memory, the MOS type solid-state image pickup device may not require a signal processing circuit to process a signal obtained after the cell output was converted into the analog signal and a yield in the manufacturing process of the MOS type solid-state image pickup device can be increased.

Since the cell output from the MOS type solid-state image pickup device is converted into the digital signal and this digital signal is demultiplexed and stored in the memory on the signal processing chip side, a plurality of pixels can be collected as one cell and digital signals corresponding to those pixels can be collected at the unit of a plurality of cells and can be output to the signal processing chip side through one micro pad. Accordingly, the number of pixels per micro pad can be increased, the micro pad can be increased in size and it can also be decreased in density.

In general, the MOS type solid-state image pickup device in which pixel characteristics are difficult to become uniform is low in yield as compared with the signal processing chip. According to the embodiments of the present invention, since the MOS type solid-state image pickup device side does not include a control circuit, that is, it has an arrangement in which other circuits than the pixels can be decreased as much as possible, the useless area can be decreased and a cost of the system including the MOS type solid-state image pickup device and the signal processing chip can be decreased.

According to the embodiment of the MOS type solid-state image pickup device of the present invention, since the MOS type solid-state image pickup device includes a unit pixel cell or a cell having a plurality of pixels: including a photoelectric-converting element, an amplifying transistor including the gate to receive signal electrical charges from the photoelectric-converting element, an output line directly or indirectly connected to the source of the amplifying transistor, an injection transistor of which drains is directly or indirectly connected to the output line, a wiring connected to the source of the injection transistor to supply a first voltage, a reset mechanism for resetting a gate potential of the amplifying transistor, an activation transistor of which source is directly or indirectly connected to the drain of the amplifying transistor and a wiring directly or indirectly connected to the drain of the activation transistor to supply a second voltage, all pixels or a large number of pixels can be driven at the same time and pixel signals can be read out at the same time. Further, the cell includes the activation transistor and the injection transistor and both of the activation transistor and the injection transistor can be prevented from being turned on at the same time so that a constant electric current can be prevented from flowing and the MOS type solid-state image pickup device includes the cells of the order of 1,000,000. Thus, when all pixels or a large number of pixels can be driven at the same time and pixels signals can be read out at the same time, a large electric current can be prevented from flowing and hence a problem of an electric current can be solved.

In the above-described MOS type solid-state image pickup device, since the reset mechanism is supplied with a reset pulse, the reset pulse overlapping with a first injection pulse supplied to the injection transistor and the reset pulse being ended before the end of the first injection pulse, the output line electrical potential obtained immediately after the reset pulse can be made equal to the ground electrical potential and hence the output line electrical potential can be prevented from being fluctuated.

In the above-described MOS type solid-state image pickup device, since the cell includes the transfer transistor and the transfer pulse supplied to the transfer transistor is ended before the second injection pulse supplied to the injection transistor is started, the voltage can be lowered. That is, as compared with the case in which the transfer pulse overlaps with the second injection pulse, the electrical potential obtained from the floating diffusion (FD) upon transfer is high owing to the effectiveness of the capacity coupling within the pixel so that the voltage can be lowered.

DESCRIPTION OF THE PREFERRED EMBODIMENTS

The present invention will now be described below with reference to the drawings.

Figure 3A:
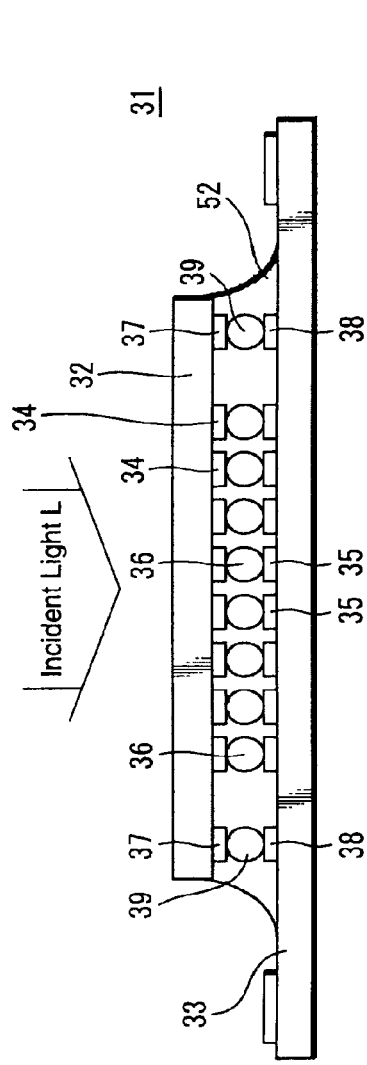
FIG. 3A is a side view showing a semiconductor module according to an embodiment of the present invention.
Figure 3B:
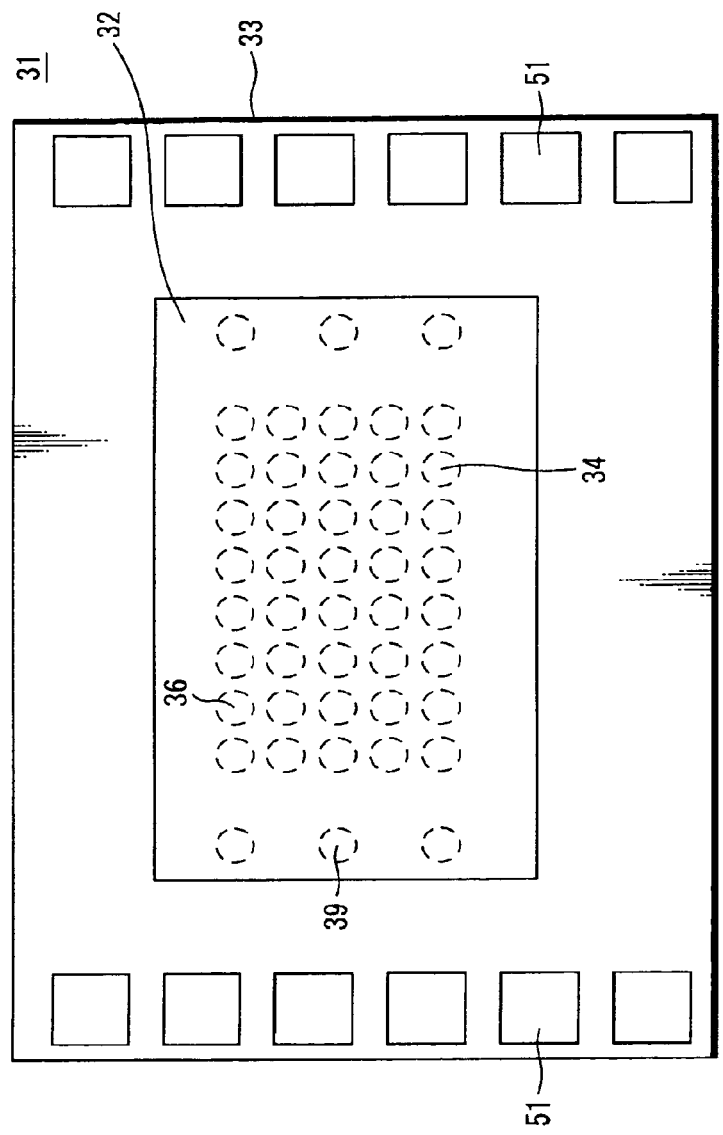
FIG. 3B is a plan view showing the semiconductor module according to the embodiment of the present invention.

FIGS. 3A and 3B show a fundamental structure of a semiconductor module according to an embodiment of the present invention. More specifically, FIG. 3A is a side view showing a semiconductor module according to an embodiment of the present invention and FIG. 3B is a plan view thereof.

A semiconductor module, generally depicted by reference numeral 31 in FIGS. 3A and 3B, includes a MOS type solid-state image pickup device (hereinafter referred to as a "MOS type image sensor chip") 32 and a signal processing chip (that is, DSP (digital signal processing) chip) 33 which are laminated with each other. As shown in FIGS. 3A and 3B, the signal processing chip 33 is connected to the MOS type image sensor chip 32 and processes an output supplied from the MOS type image sensor chip 32. Further, it is needless to say that the signal processing chip 33 may have a function to control the MOS type image sensor chip 33.

Figure 4:
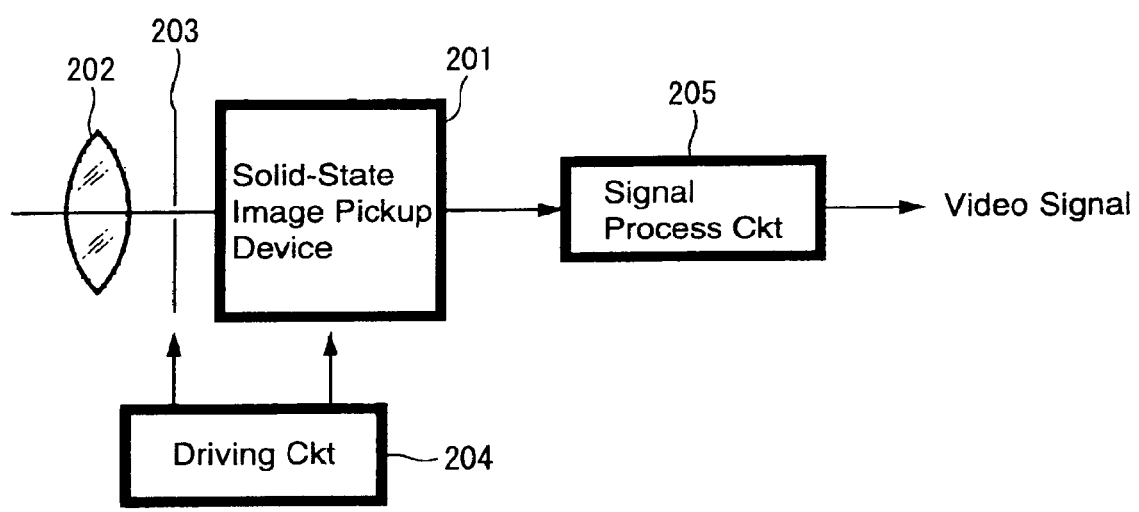
FIG. 4 is a cross-sectional view showing an arrangement of a video camera according to an embodiment of the present invention.

FIG. 4 is a cross-sectional view showing an arrangement of a camera according to an embodiment of the present invention. A camera according to this embodiment is an example of a video camera capable of shooting moving pictures.

As shown in FIG. 4, a camera according to this embodiment includes a solid-state image pickup device 201, an optical system 202, a shutter device 203, a driving circuit 204 and a signal processing circuit 205.

The optical system 202 is adapted to focus image light (incident light) from an object on an image pickup surface of the solid-state image pickup device 201, whereby signal electrical charges are accumulated in the solid-state image pickup device 201 during a constant time period.

The shutter device 203 is adapted to control a time period in which light is irradiated on the solid-state image pickup device 201 and a time period in which irradiation of light on the solid-state image pickup device 201 is shielded.

The driving circuit 204 is adapted to supply drive signals to control transfer operations of the solid-state image pickup device 201 and shutter operations of the shutter device 203. Based on drive signals (timing signals) supplied from the driving circuit 204, signal electrical charges are transferred in the solid-state image pickup device 201. The signal processing circuit 205 is adapted to carry out various kinds of signal processing. A video signal obtained after the signal processing may be stored in a storage medium such as a memory or is output to a monitor, although not shown.

Figure 5:
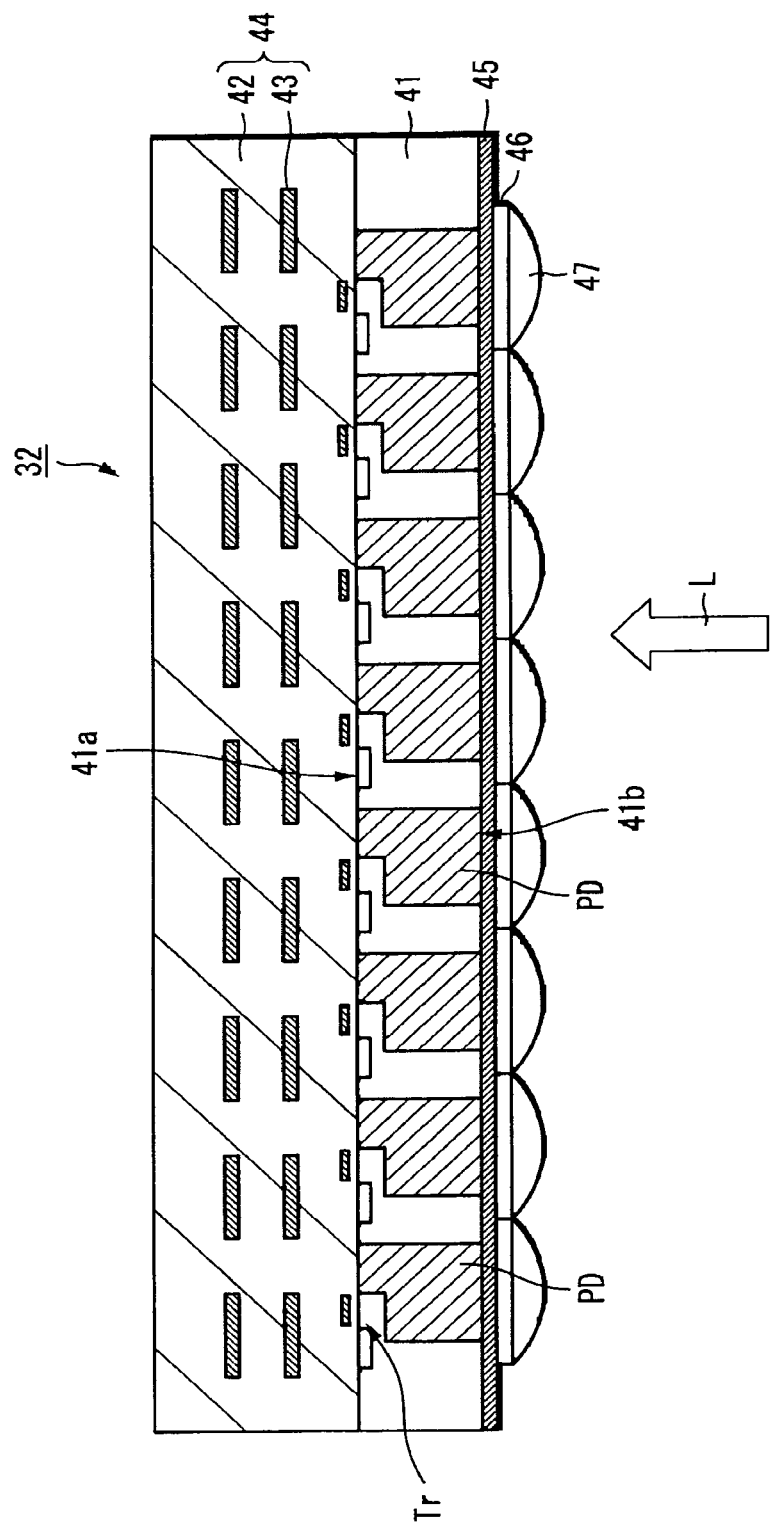
FIG. 5 is a schematic diagram showing an arrangement of a back-illuminated MOS type solid-state image pickup device.

The MOS image sensor chip 32 is formed as a back-illuminated (that is, backside light input) type MOS image sensor chip. The back-illuminated type MOS image sensor chip 32 has an arrangement in which a wiring layer is formed on the substrate surface side to introduce light from the substrate back side located on the opposite side of the wiring layer. FIG. 5 is a schematic diagram showing an arrangement of the back-illuminated type MOS image sensor chip 32. As shown in FIG. 5, this back-illuminated type MOS image sensor chip 32 includes a photodiode PD serving as a photoelectric-converting element having a light incident surface on the side of a back surface 41b of a semiconductor substrate 41. A plurality of MOS transistors Tr serving as means for reading out signal electrical charges from the photodiode PD is formed on the front surface side of the semiconductor substrate 41. Further, a wiring layer 44 formed of a multilayer wiring 43 with an interlayer insulator 42 is formed on the front surface side of the semiconductor substrate 41. The photodiode PD is formed from the side of a front surface 41a of the semiconductor substrate 41 to the side of a back surface 41b. A color filter 46 and an on-chip micro lens 47 corresponding to each pixel are formed on the side of a back surface 41b on which light L becomes incident through a passivation film 45. A supporting substrate made of a suitable substrate material such as a silicon substrate may be bonded to the wiring layer 44, although not shown.

Referring back to FIGS. 3A and 3B, a large number of micro pads 34 are formed at every unit pixel cell or at every cell of a plurality of cells on the surface (surface of the supporting substrate if the MOS type image sensor chip 32 includes the supporting substrate) of the wiring layer 44 side of the MOS type image sensor chip 32 at its region corresponding to at least the pixel portion (so-called pixel region portion), as will be described later on. Further, a large number of micro pads 35 corresponding to the micro pads 34 of the MOS type image sensor chip 32 are formed on the surface of the wiring layer of the signal processing chip 33. Then, the MOS type image sensor chip 32 and the signal processing chip 33 are unitarily formed as one body by electrically connecting the corresponding micro pads 34 and 35 through the micro bump 36. The micro pads 34, 35 are formed of micro pads which are smaller than ordinary pads. For example, the micro pads 34, 35 may be formed of micro pads of 10 μm square which are smaller than ordinary pads of 50 μm square. The micro bumps 36 are formed on these micro pads 34, 35. Unlike the ordinary layout of the pads, a large number of micro pads 34, 35 can be formed near the center of the chip. As the size of the micro bump 36 (this relationship will apply for a micro bump, which will be described later on, as well), the diameter of the micro bump 36 can be selected to be 30 μm or less and further the diameter of the micro bump 36 can be selected in a range from 10 μm to 5 μm.

A large number of micro pads 34, 35 and micro bumps 36 are formed corresponding to pixel portions of the MOS type image sensor chip 32. Preferably, micro pads 37, 38 and micro bumps 39 should be formed in the regions corresponding to the periphery of the pixel portion, as will be described later on.

The signal processing chip 33 is formed with an area larger than that of the MOS type image sensor chip 32. An ordinary pad 51 is formed on this signal processing chip 33 at its position corresponding to the outside of the MOS type image sensor chip 32, thereby constructing an interface with other system than the system of these two chips. An ordinary pad, which is used after the MOS type image sensor chip 32 was bonded to the signal processing chip 33, is not disposed on the side of the MOS type image sensor 32. Although not shown in order to express a fundamental concept clearly, ordinary pads for test and selection should preferably be located on the side of the MOS type image sensor chip 32.

After being connected through the micro bumps 36, 39, the signal processing chip 33 and the MOS type image sensor chip 33 are sealed by a sealing member 52, for example, a resin at least in the peripheral portion.

According to the semiconductor module 31 of this embodiment, by the arrangement shown in FIGS. 3A and 3B, it is possible to solve various problems encountered with the related art, such as complexity of a manufacturing process in which wirings are formed through the semiconductor substrate, an increased manufacturing cost, a lowered yield, a problem in which a pixel aperture ratio is decreased by a pixel circuit and a problem in which an optically useless area of a region to pass a penetrated wiring is increased. Specifically, since the MOS image sensor chip 32 is formed as the back-illuminated type MOS image sensor chip, the aperture ratio of the pixel can be increased. Since both of the MOS type image sensor chip 32 and the signal processing chip 33 are connected through the micro bumps 36, 39, a manufacturing process can be facilitated and a yield can be increased. Since the MOS type image sensor chip 32 and the signal processing chip 33 are connected not by using a penetrating wiring but by the micro bumps 36, 39, it is possible to decrease the optically useless area.

According to this arrangement, although a large number of chips may not be laminated by connecting bumps unlike the related-art example 2, from standpoints of a yield, heat generated from the lower side chip 33 (that is, signal processing chip 33) and an overall height, it should be preferable to connect only the MOS type image sensor chip 32 and the signal processing chip 33. That is, if chips are laminated in a number of stages, then much heat generated from the lower side chip flows into the image sensor to deteriorate, in particular, a dark characteristic. However, according to the arrangement of this embodiment in which two chips 32 and 33 are laminated with each other, since the lower side chip is the signal processing chip 33 only, a small amount of heat generated from the signal processing chip 33 flows into the MOS type image sensor chip 32 and hence a deterioration of a dark characteristic does not become a serious problem. Also, in a CMOS (complementary metal-oxide semiconductor) sensor, it is frequently desired that a height of a module with a lens should be decreased as much as possible. According to the arrangement of this embodiment, it is possible to keep the height of the semiconductor module 31 to be low.

Figure 6:
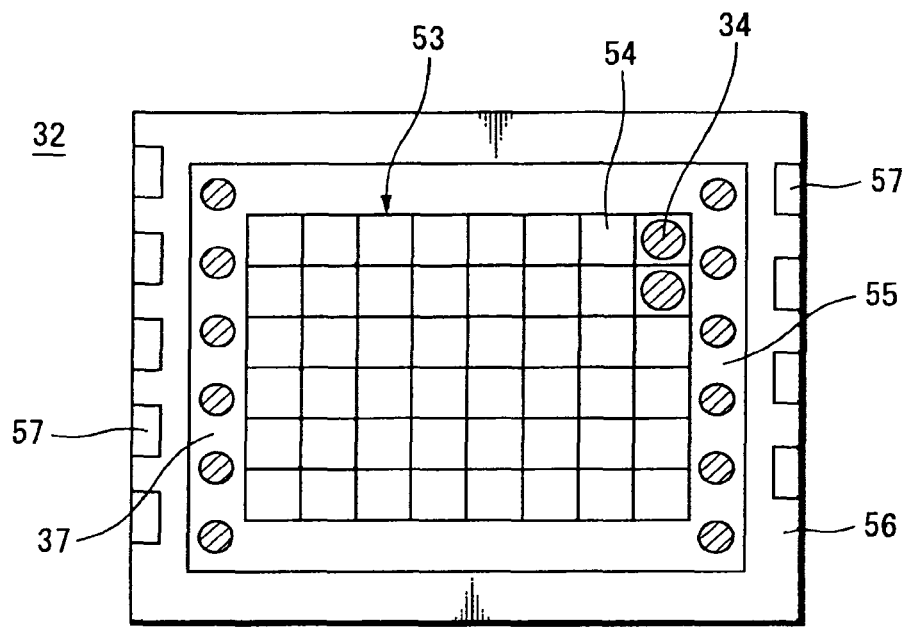
FIG. 6 is a schematic diagram showing a MOS type image sensor chip according to an embodiment of the present invention.

FIG. 6 is a block diagram showing the MOS image sensor chip 32. As shown in FIG. 6, this MOS type image sensor chip 32 includes a central region pixel portion 53 in which a large number of cells 54 are arrayed. The cell 54 may be a unit pixel or may be formed of a plurality of pixels. Then, the micro pad 34 (see FIGS. 3A and 3B) is arrayed on the aforementioned wiring layer side at every cell 54 and the pixel portion 53 has a pixel drive unit 55 formed around it. In this pixel drive unit 55, there are arrayed a large number of micro pads 37 (see FIGS. 3A and 3B) which are used to supply a signal and a power to drive a pixel and to supply a ground (GND). A test pad 56 in which ordinary pads 57 for test are arrayed is formed around the pixel drive unit 55.

A pixel output is supplied to the micro pads 34 of the pixel portion 53. The micro pad 37 of the pixel drive unit 55 is supplied with the pixel drive signal, a power supply and a ground (GND). As described above, it is preferable that the MOS type image sensor chip 32 side should not include a control circuit. The reason for this will be described below. Since the MOS image sensor chip of which pixel characteristics are difficult to become uniform is generally lower in yield than the signal processing chip, if the MOS type image sensor chip does not include other circuits than the pixel as much as possible, then it is possible to decrease the optically useless area. Furthermore, another reason for this is that the MOS type image sensor chip can be manufactured with a design rule which is looser than that of the signal processing chip.

Figure 7:
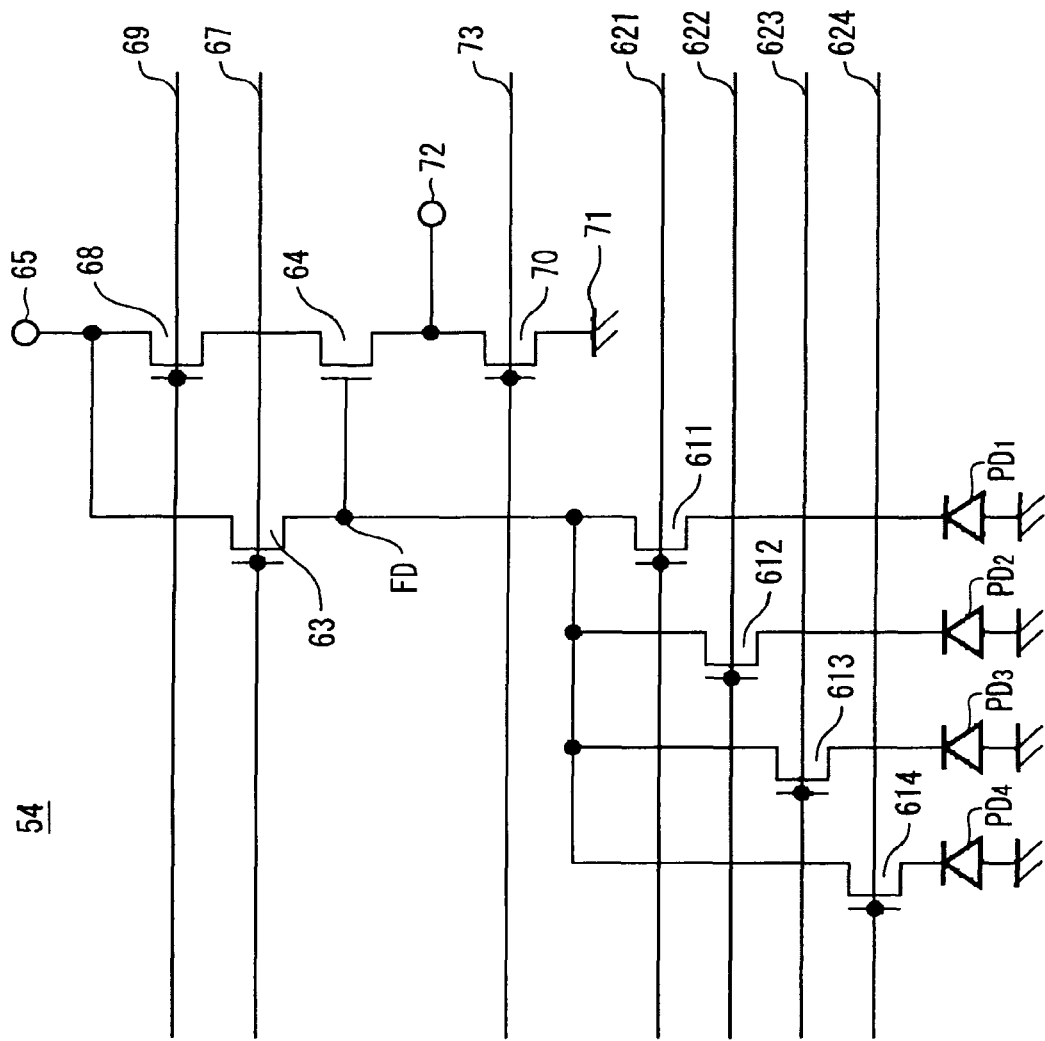
FIG. 7 is a circuit diagram showing an example of an arrangement of one cell of the MOS type image sensor chip according to an embodiment of the present invention.

FIG. 7 is a diagram showing an example of the cell 54. In this embodiment, four pixels are collected to form one cell 54. As shown in FIG. 7, the cell 54 according to this embodiment includes four photodiodes PD [PD1, PD2, PD3, PD4]. The respective photodiodes PD1 to PD4 are connected to corresponding four transfer transistors 61 [611, 612, 613, 614], respectively, and the gates of the transfer transistors 61 [611 to 614] are connected to transfer wirings 62 [621 to 624] to which transfer pulses are supplied. The drains of the respective transfer transistors 611 to 614 are connected commonly and then connected to the source of a reset transistor 63. Also, a so-called floating diffusion FD between the drain of the transfer transistor 61 and the source of the reset transistor 63 is connected to an amplifying transistor 64. The drain of the reset transistor 63 is connected to a power source wiring 65 to which a power source voltage is supplied, and the gate thereof is connected to a reset wiring 67 to which a reset pulse is supplied. An activation transistor 68 is provided at the selection transistor shown in FIG. 2 in the related-art example. Specifically, there is provided the activation transistor 68 whose drain is connected to the power source wiring 65 and the source thereof is connected to the drain of the amplifying transistor 64. The gate of the activation transistor 68 is connected to an activation wiring 69 to which an activation pulse is supplied. An injection transistor 70 is connected to the source of the amplifying transistor 64. The source of the injection transistor 70 is connected to the ground (GND) and the gate thereof is connected to an injection wiring 73 to which an injection pulse is supplied. Then, a connection point between the amplifying transistor 64 and the injection transistor 70 is connected to an output line (or output terminal) 72.

Figure 1:
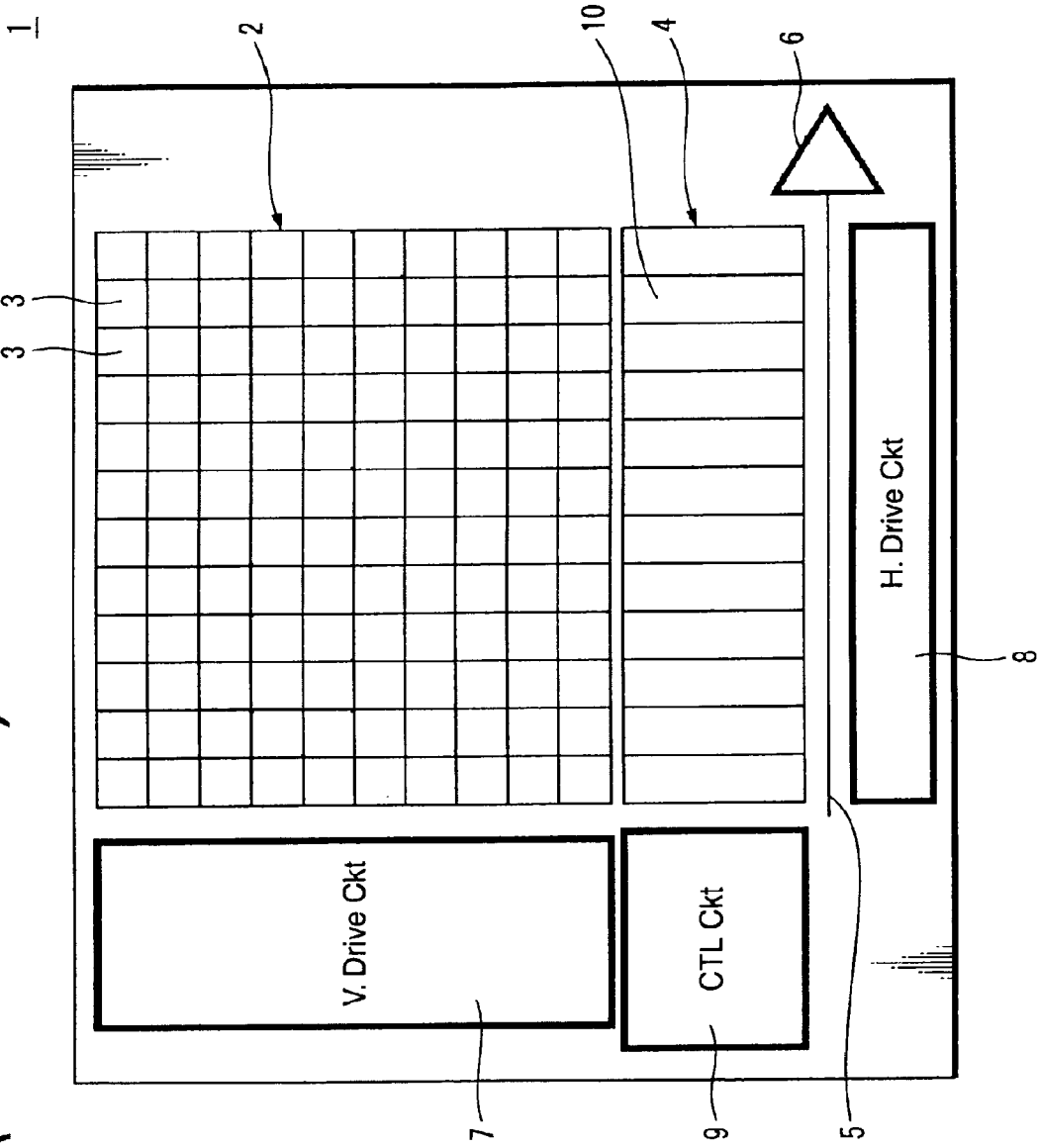
FIG. 1 is a schematic diagram showing an example of a MOS type image sensor according to related art.
Figure 2:
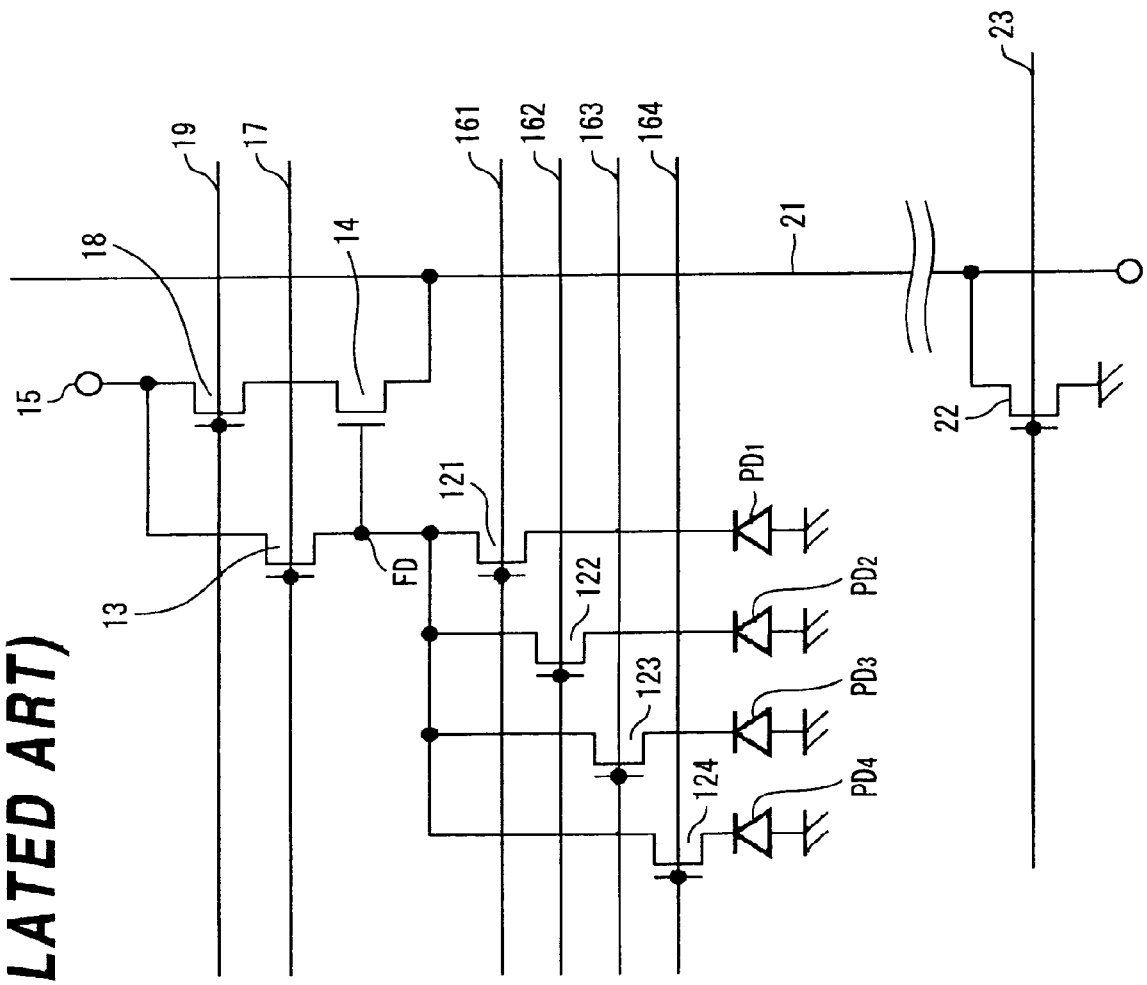
FIG. 2 is a circuit diagram showing an example of a pixel circuit in the MOS type image sensor shown in FIG. 1.

From a circuit standpoint, this embodiment is different from the related-art example shown in FIG. 2 in that the pixel includes therein the injection transistor 70 and the ground wiring 71 and that the output line 72 is not extended in the vertical direction but it is independent at every cell 54. In this cell 54, the corresponding transistors 61 [611 to 614] are turned ON in response to the transfer pulses supplied to the transfer wirings 62 [621 to 624] and thereby signal electrical charges of the corresponding photodiodes PD [PD1 to PD4] are transferred to the floating diffusion FD. Also, in response to the reset pulse supplied to the reset wiring 67, the reset transistor 63 is turned ON and thereby signal electrical charges (electrons in this embodiment) of the floating diffusion FD are discarded to the power source wiring 65, thus resulting in the potential of the floating diffusion FD being made equal to the power source potential.

Next, operations of this cell 54 will be described with reference to FIG. 8. First, the injection transistor 70 is turned ON with application of an injection pulse 1 (Pn1) through the injection wiring 73 and the output line 72 is fixed to 0V. After this output line 72 was fixed to 0V, the reset transistor 63 is turned ON with application of a reset pulse Pr through the reset wiring 67 and thereby the potential of the floating diffusion FD is reset to a high level (power source electrical potential). When the floating diffusion FD is set to the high level, the amplifying transistor 64 is turned ON. Next, after the injection transistor 70 was turned OFF, the activation transistor 68 is turned ON with application of an activation pulse Pk1 through the activation wiring 69.

When the activation transistor 68 is turned ON, the electrical potential of the output line 72 is raised to the level corresponding to the potential of the floating diffusion FD. This output line electrical potential is referred to as a "reset level".

Next, the activation transistor 78 is turned OFF and thereby the transfer pulse Pt1 is supplied to the transfer wiring 621. The transfer transistor 611 is turned ON and thereby signal electrical charges of the corresponding photodiode PD1 are transferred to the floating diffusion FD. Then, the injection transistor 70 is turned ON with application of an injection pulse 2 (Pn2) and the output line 72 is set to 0. Then, when the activation transistor 68 is turned ON with application of an activation pulse Pk2, the potential of the output line 72 is raised to the level corresponding to the potential of the floating diffusion FD obtained at that time. The output line electrical potential obtained at this time is referred to as a "signal level".

The electrical potential of the output line 72 is supplied through the micro bump 36 to the signal processing chip 33 (see FIGS. 3A and 3B). In the signal processing chip 33, a difference between the signal level and the reset level is analog-to-digital converted and is thereby processed in a digital signal processing fashion. In this embodiment, of four photodiodes PD [PD1 to PD4], the signal was read out from one photodiode PD1. Similar operations are effected on other three remaining photodiodes PD2 to PD4, in that order.

Figure 8:
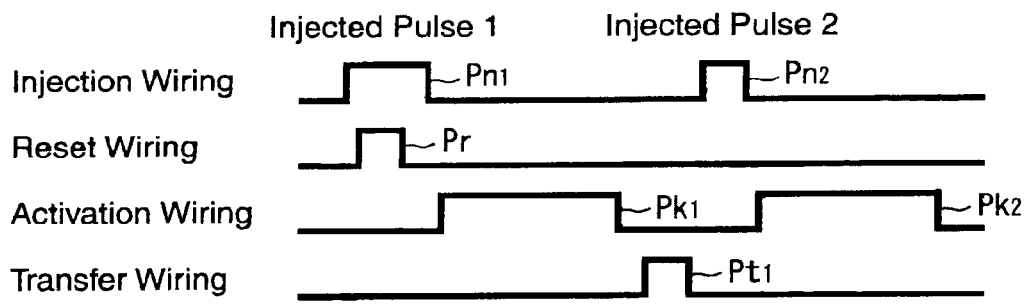
FIG. 8 is a drive timing chart of the cell arrangement shown in FIG. 7.

As shown in FIG. 8, it is preferable that the reset pulse Pr should overlap with the injection pulse 1 (Pn1), the reset pulse Pr being lowered before the injection pulse 1 (Pn1). The reason for this is that the output line potential obtained immediately after the reset pulse Pr is lowered is set to 0V so that such output line electrical potential can be prevented from being fluctuated. Also, it is preferable that the transfer pulse Pt1 should be lowered before the injection pulse 2 (Pn2) is raised from a low voltage standpoint. The reason for this is that since the floating diffusion FD potential obtained upon transfer is high as a result of a capacity coupling within the pixel as compared with the case when the transfer pulse Pt1 overlaps with the injection pulse 2 (Pn2), the voltage can be lowered. It is needless to say that the present invention may not be limited to the above-mentioned cases when these voltage drops need not be considered strictly.

While operations of one cell have been described so far, a large number of cells are arranged in the pixel portion. In this embodiment, a large number of pixels are driven simultaneously. In that case, since an electric current flows to a large number of cells (for example, 1,000,000 cells) at the same time in the source follower operation using a constant electric current source according to related art, its electric current value is increased so that reliability is lowered and that a power supply voltage is lowered due to a wiring resistance. Therefore, according to this embodiment, as described above, the injection transistor 70 is located in the cell and it can be prevented from being turned on at the same time the activation transistor 68 is turned on, thereby preventing a constant electric current from flowing to the cells.

Figure 9:
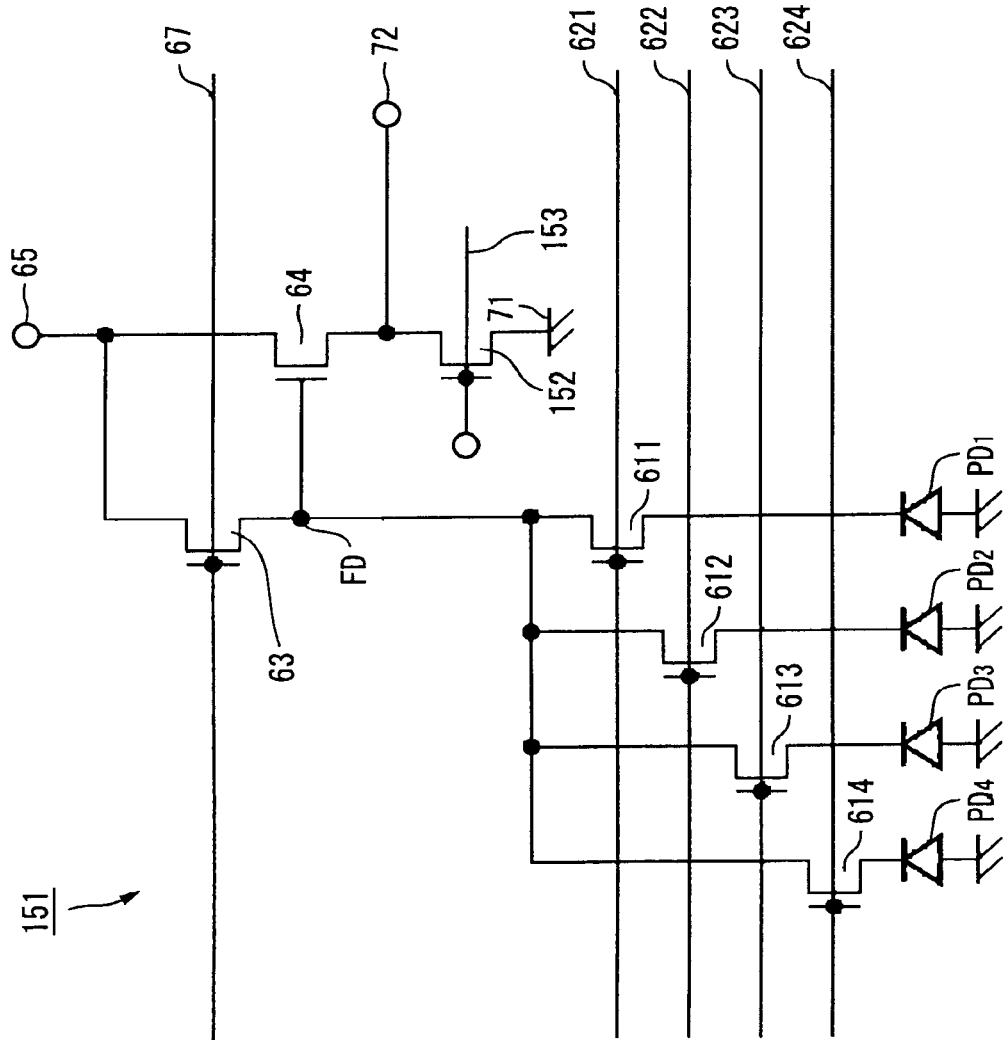
FIG. 9 is a circuit diagram showing another example of an arrangement of one cell of the MOS type image sensor chip according to an embodiment of the present invention.

In this embodiment, the cells need not be selected at the unit of rows and hence the selection transistor is not required. If the MOS type solid-state image pickup device does not have many pixels or the required specifications are not so severe, then it is possible that the cell without the activation transistor 68 may carry out the related-art source follower operation. FIG. 9 is a circuit diagram showing an example of a cell circuit of this case.

As shown in FIG. 9, four pixels are collected to form one cell 151 similarly as described before. The cell 151 according to this embodiment includes four photodiodes PD [PD1, PD2, PD3, PD4], and the respective photodiodes PD1 to PD4 are connected to corresponding four transfer transistors 61 [611, 612, 613, 614], respectively. The respective gates of the transfer transistors [611 to 614] are connected to transfer wirings 62 [621 to 624] to which transfer pulses are supplied, respectively. The drains of the respective transfer transistors 611 to 614 are connected to be common and connected to the source of a reset transistor 63 and a floating diffusion FD between the drain of the transfer transistor 61 and the source of the reset transistor 63 is connected to an amplifying transistor 64. The drain of the reset transistor 63 is connected to a power supply wiring 65 to which a power supply voltage is supplied and the gate thereof is connected to a reset wiring 67 to which a reset pulse is supplied. The drain of the amplifying transistor 64 is connected to the power supply wiring 65. A load transistor 152 is connected to the source of the amplifying transistor 64. The source of the load transistor 152 is connected to the ground (GND) and the gate thereof is connected to a load wiring 153. Then, a connection point between the amplifying transistor 64 and the load transistor 152 is connected to an output line 72.

In this embodiment, while the control wirings 69, 67, 73, 621 to 624 are all extended in the lateral direction in FIG. 7, the present invention is not limited thereto. That is, since all cells are operated at the same time, control wirings may be extended in the vertical direction, control wirings may be extended both in the lateral and vertical directions. Alternatively, control wirings may be extended in a lattice fashion in which control wirings may be connected in the vertical and lateral directions. Also, when all cells are driven at the same time so that the electrical current value is increased too much, the operation of the MOS type solid-state image pickup device may be divided into operations of cells of several 10s of rows. In this connection, while the circuit of this cell and the driving method thereof are particularly effective for the case in which the back-illuminated MOS type solid-state image pickup device and the micro bumps are combined, when all pixels or a large number of pixels are driven at the same time and pixel signals are output at the same time although the present invention is independent of such combination, the circuit of this cell and the driving method thereof are efficient from a standpoint of the above-mentioned electric current problem.

Figure 10:
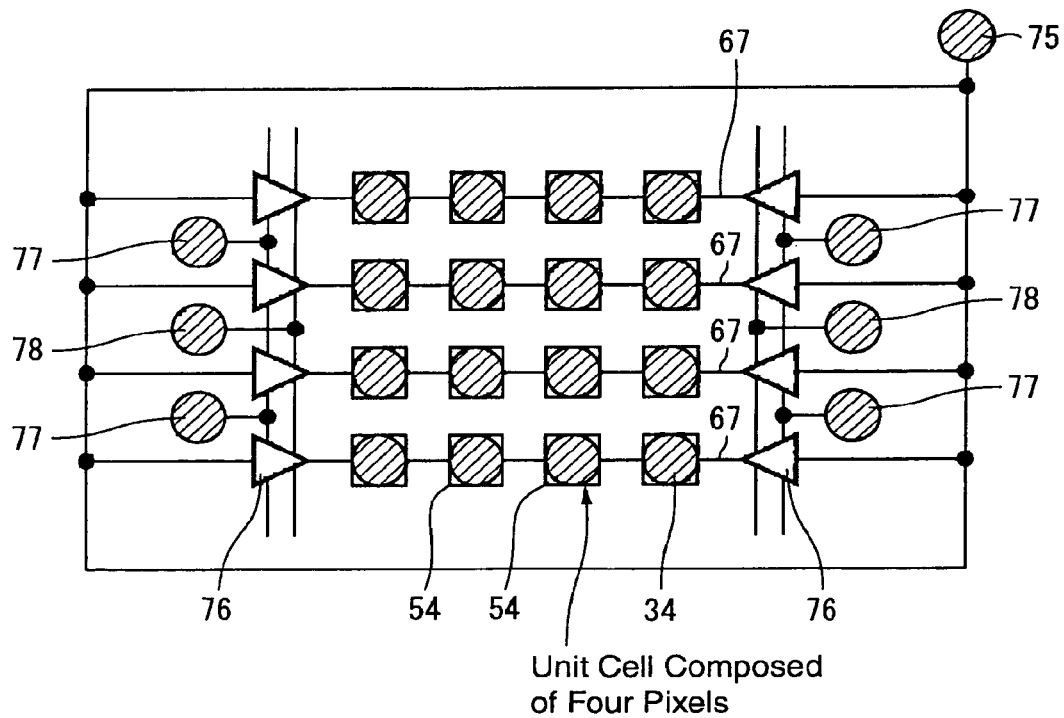
FIG. 10 is a conceptual diagram showing an example of the layout of micro pad according to an embodiment of the present invention.

FIG. 10 is a conceptual diagram showing an example of an array of micro pads in the form of cell arrangement of 4 rows×columns concerning the cell output and the portion of the reset pulse for simplicity. As shown in FIG. 10, unit cells 54 including four pixels are arrayed in a 4×4 matrix fashion and micro pads 34 for analog outputs are formed at every unit cell. A reset gate drive pulse is supplied from a micro pad 75 for a reset gate drive pulse and is input into a buffer 76 from the periphery of the pixel portion. The buffer 76 is provided at every row of the cell 54 and the reset wiring 67 is located in the lateral direction. A micro pad 77 for power supply is provided at every two lines of the buffer 76. Similarly, a micro pad 78 for the supply of a ground (GND) is provided at every two lines. As described above, it is desired that the power source voltage and the ground should be supplied from many micro pads.

Figure 11:
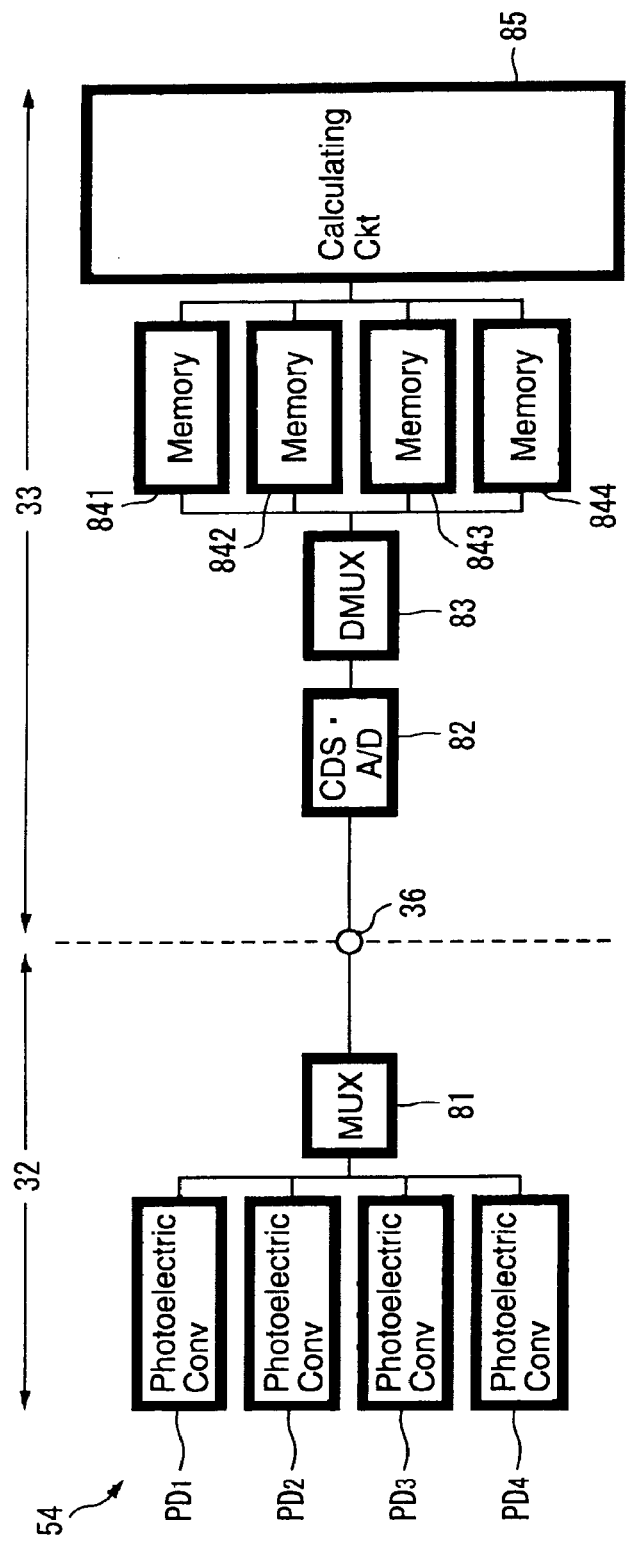
FIG. 11 is a conceptual diagram showing an example of an interconnection between the MOS type image sensor chip and a signal processing chip according to an embodiment of the present invention.

FIG. 11 is a conceptual diagram showing a connection between a MOS image sensor chip 32 and a signal processing chip according to the embodiment of the present invention. As shown in FIG. 11, on the side of the MOS image sensor chip 32, an analog multiplexer 81 is adapted to select four photodiodes (photoelectric-converting elements) PD1 to PD4 sequentially in one cell. The processing of this analog multiplexer 81 includes the corresponding processing in which the signals multiplexed by the transfer transistors 61 [611 to 614] shown in FIG. 7 are output through the amplifying transistor 64 to the output line 72. The output from the analog multiplexer 81 is supplied through a micro bump 36 to a correlated double sampling (CDS) and analog-to-digital (A/D) converting circuit 82 on the side of the signal processing chip 33, in which it is correlated-double-sampled and analog-to-digital converted. A resultant digital signal from the CSD and A/D converting circuit 82 is supplied through a digital demultiplexer 83 and is then stored in frame memories 84 [841 to 844].

A calculating circuit 85 properly refers to the values stored in the frame memories 84 and processes them in a digital signal fashion. Herein, although the connections of the above-mentioned circuit components of one cell have been described so far, in actual practice, these circuit components may be provided at every cell and they may be operated in parallel to each other. However, the calculating circuit 85 need not always be provided at every cell but one calculating circuit 85, for example, may refer to the values stored in the frame memories 84 [841 to 844] and it may process them in the sequential order. Also, the demultiplexer 83, the frame memory 84 and the calculating circuit 85 need not always be separated from each other explicitly but they may be integrated to some extent insofar as they can carry out equal signal processing.

Figure 12:
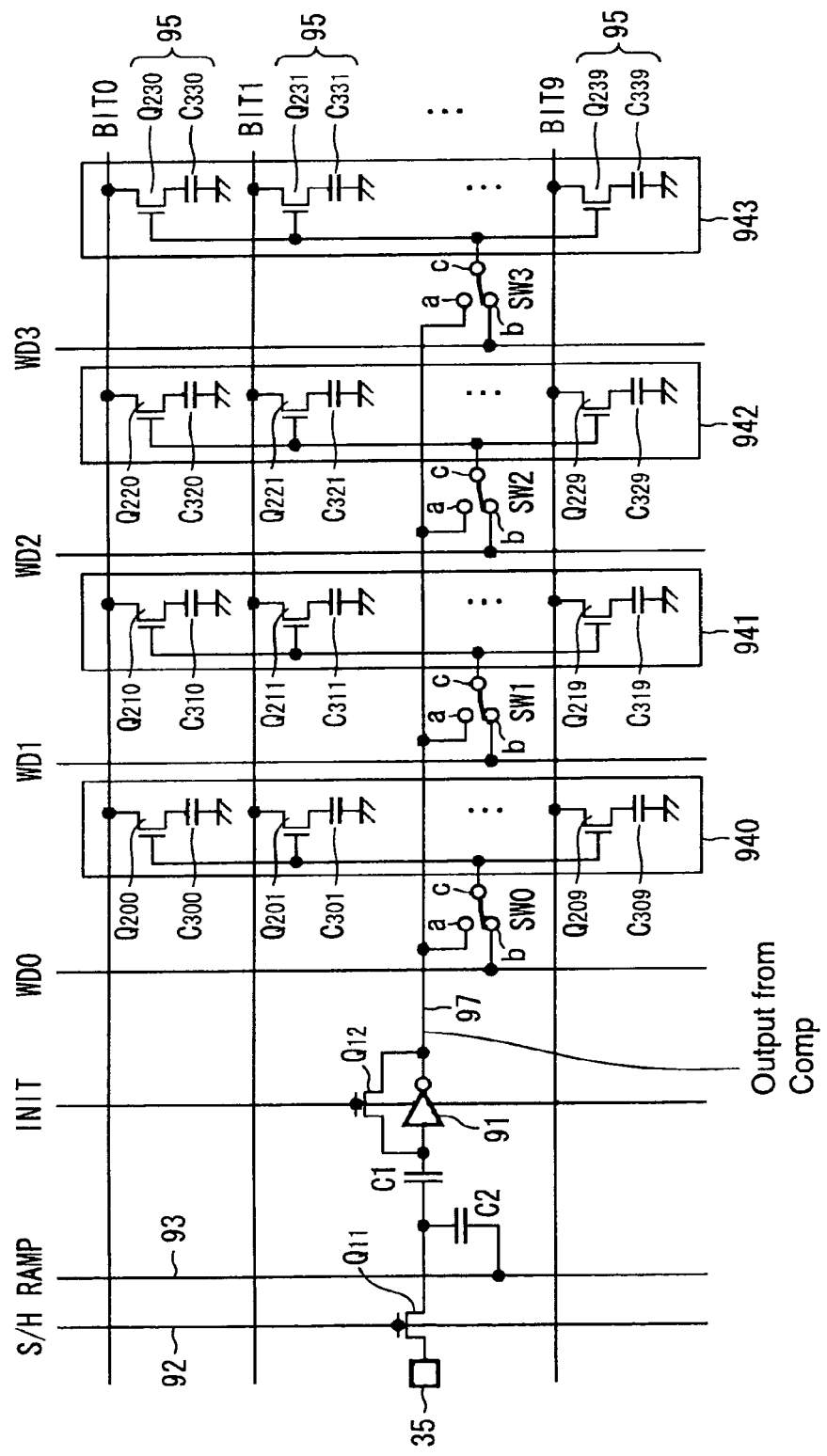
FIG. 12 is a circuit diagram showing an example of a correlation double sampling (CDS)/analog-to-digital (A/D) circuit on the signal processing chip side according to an embodiment of the present invention.

For example, a cell corresponding to the signal processing chip 33 has an arrangement including comparators and latches as shown in FIG. 12. In the circuit shown in FIG. 12, the micro pad 35 is connected to a sample and hold circuit formed of a switching transistor Q11 and a sample and hold capacity C2 and this sample and hold circuit is connected through a DC cut capacity C1 to an inverter 91. The gate of the switching transistor Q11 is connected to a sample and hold wiring 92 to which a sample and hold pulse is supplied. The other end of the sample and hold capacity C2 is connected to a ramp wiring 93 to which a ramp wave (voltage being raised with time) is supplied. An initialize switch (MOS transistor) Q12 is connected between the input and output of the inverter 91.

On the other hand, as shown in FIG. 12, four word lines WD0 to WD3 are provided corresponding to four pixels constituting one cell, and a plurality of, in this embodiment, 10 bit lines BIT [BIT0 to BIT9] are provided in the direction perpendicular to the word lines WD0 to WD3. Also, DRAM (dynamic random-access memory) cell groups 94 [940 to 943] of four columns are provided corresponding to four pixels. Each DRAM cell is formed of one MOS transistor Q2 [Q200 to Q209, Q210 to Q219, Q220 to Q229, Q230 to Q239] and one capacity C3 [C300 to C309, C310 to C319, C320 to C329, C330 to C339]. The DRAM cell groups 940 to 943 of each column are formed of 10 DRAMs 95. The gates of the respective MOS transistors Q2 within the DRAM cell group 94 are connected to be common and are respectively connected through switches SW [SW0 to SW3] to the corresponding word lines WD0 to WD3. Movable contacts c of the switches SW are connected to the gates of the MOS transistors Q2, first fixed contacts a thereof are connected to the output line 97 of the inverter 91 and second fixed contacts b thereof are connected to the corresponding word lines WD0 to WD3.

As shown in FIG. 12, an analog signal input from the micro pad 35 through the micro bump 36 is cut in DC component by the capacity C1 and is supplied to the inverter 91. The inverter 91 constitutes a comparator together with the initialize switch Q12 (wiring is INIT). When the aforementioned reset level is input to the comparator from the micro pad 35 through the micro bump 36, the input reset level is initialized. Then, when the signal level is input to the comparator, the input of the inverter 91 is lowered by an amount fundamentally proportional to a difference between the input signal level and the reset level and the output of the inverter 91 goes to a high level. Thereafter, when a ramp wave is input to the ramp wiring 93, a voltage value of the bit line BIT which is obtained when the comparator is inverted is latched in the DRAM cell 95 so that the signal processed by the CDS and A/D converter circuit 82 (FIG. 11) is stored in the frame memories 84 [841 to 844]. The switches SW0 to SW3 are adapted to demultiplex the signals of four pixels contained in the cell and to connect the signals to the word lines WD0 to WD3 when the DRAM cell is read. Herein, an example in which 10-bit data is A/D-converted is illustrated in the above and hence 10-bit gray code value is input to the bit line BIT [BIT0 to BIT9]. From a theory standpoint, the A/D converting circuit formed of the comparator and the latch is well known from a long time ago and hence it need not be described.

When this operation is effected on all cells at the same time, the signals of the four pixels of the cell are sequentially supplied to the signal processing chip 33, in which they are analog-to-digital converted and thereby digital data of one frame is stored in the signal processing chip 33 side. When data of one frame is output, since it is sufficient that data may be read out from the frame memory four times and hence a frame rate can be made high in speed. Further, although a time difference of a very short time period occurs in the four pixels of one cell, a time difference may not occur in the picture from a band standpoint so that simultaneity may be established within the picture. The signal processing chip 33 carries out the camera signal processing by using this digital data of one frame.

Figure 13:
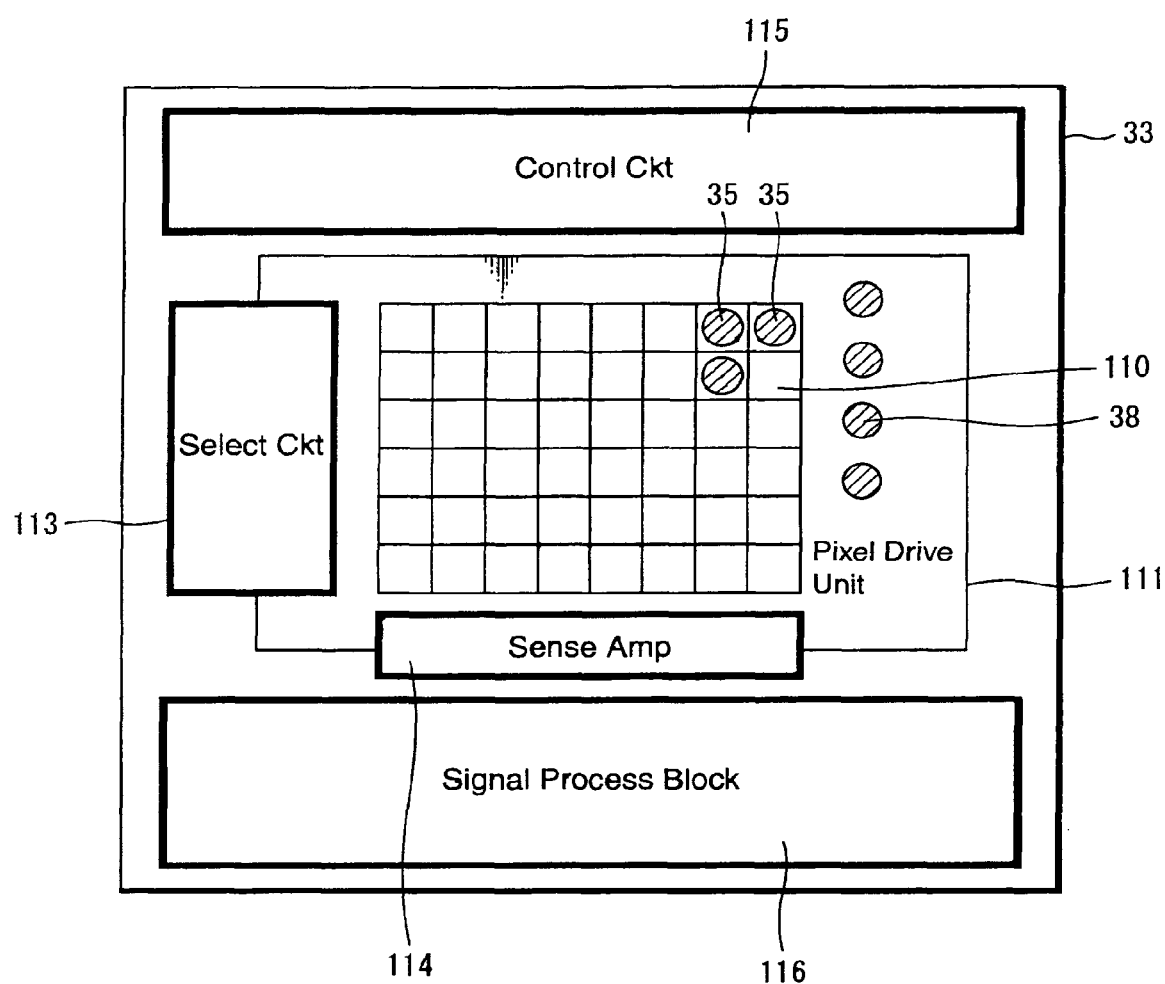
FIG. 13 is a conceptual diagram showing an example of the signal processing chip side according to an embodiment of the present invention.

FIG. 13 is a schematic diagram showing a circuit layout of the signal processing chip 33. As shown in FIG. 13, a cell 110 on the side of the signal processing chip 33 includes the micro pad 35 corresponding to a cell 54 on the side of the MOS type image sensor chip 32. A pixel driving portion 111 with micro pads 38 arrayed thereon to supply drive signals and power supply voltages to the side of the MOS type image sensor chip 32 is provided around the micro pads 35. Since it is sufficient that there may be provided the micro pad 38 using the wiring of the upper layer, it is possible to locate a circuit formed of a transistor and a wiring of a lower layer under the micro pad 38. In this example, a selecting circuit 113 and a sense amplifier 114 of the cell 110 on the side of the signal processing chip 33 are partly overlaid over the pixel driving portion 111. A control circuit 115 for controlling operations of respective portions and a signal processing circuit 116 for carrying out signal processing with reference to data of the frame memory are provided above and under the pixel driving portion 111. In this example, from a standpoint of a circuit area, the signal processing may be carried out by sequentially reading data outside the cell 110 on the side of the signal processing chip 33. If the signal processing circuit 116 can be embedded into the cell 110 because the pixel is large in size and the like, then the signal processing circuit 116 can be embedded into the cell 110.

It is preferable that the MOS type image sensor chip 32 should be manufactured by an old and loose process (for example, 0.25 µm) in which a photodiode can be inexpensively and stably manufactured relative to a specific pixel size determined by a set sensitivity and lens specifications and that the signal processing chip 33 should be manufactured a shrinkable microminiaturization process (for example, 0.06 µm). When process rules are different considerably, this embodiment in which a circuit scale per cell is large on the side of the signal processing chip 33 is efficient for such case.

Figure 14:
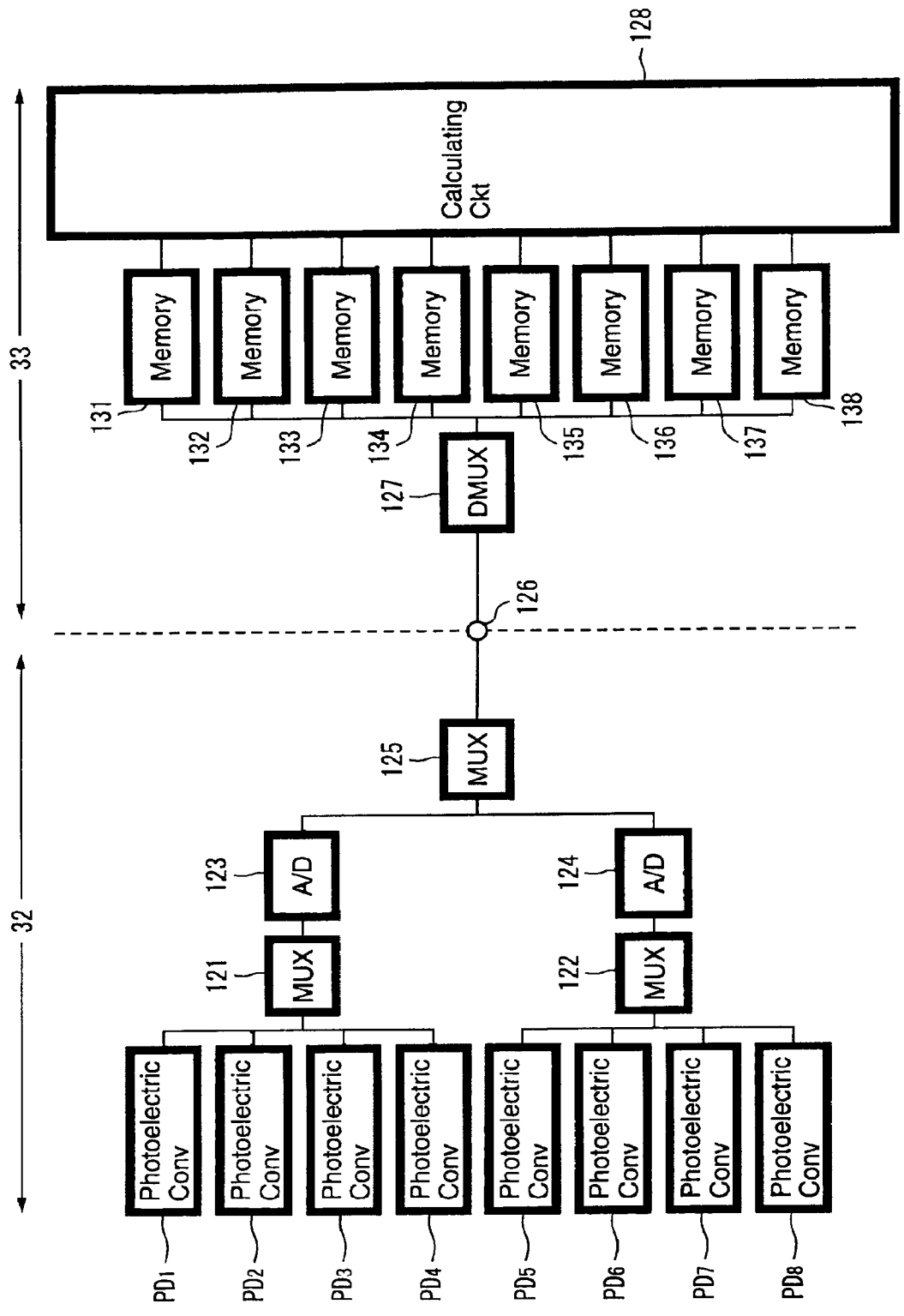
FIG. 14 is a conceptual diagram showing another example of an interconnection between the MOS type image sensor chip and the signal processing chip according to an embodiment of the present invention.

On the other hand, when the process generations of the MOS type image sensor chip 32 and the signal processing chip 33 are close to each other, it is efficient that a pixel signal should be A/D-converted on the side of the image sensor chip 32. FIG. 14 is a conceptual diagram showing another example of the connection between the MOS type image sensor chip and the signal processing chip according to the present invention. As shown in FIG. 14, on the side of the MOS type image sensor chip 32, two cells, for example, are connected to multiplexers 121, 122 which are able to sequentially select four photodiodes (photoelectric-converting elements) PD1 to PD4 and PD5 to PD8, each of four photodiodes PD1 to PD4, PD5 to PD8 being included in one cell. The first multiplexers 121, 122 are connected to corresponding A/D converting circuits 123, 124, respectively. Further, the two A/D converting circuits 123, 124 are connected to a second multiplexer 125. The signal processing chip 33 includes a demultiplexer 127 to which the output from the second multiplexer 125 is connected through a micro bump 126, memories 131 to 138 connected to the demultiplexer 127 and which correspond to the photodiodes PD [PD1 to PD4, PD5 to PD8] on the side of the image sensor chip 32 and a calculating circuit 128.

As shown in FIG. 14, after the photodiodes of the sensors were sequentially selected by the first multiplexers 121, 122 on the side of the image sensor chip 32, the pixel signals are A/D-converted by the A/D converting circuits 123, 124 and the thus A/D-converted pixel signals are selected by the second multiplexer 125, then digital data is supplied to the side of the signal processing chip 33. Digital data is supplied through the micro bump 126 to the demultiplexer 127 on the signal processing chip 33 side, in which it is distributed by the demultiplexer 127 and supplied to the memories corresponding to the pixels.

The arrangement of the signal processing chip 33 is not limited to the above-mentioned arrangement and it may be modified such that the demultiplexer 127 and the memories 131 to 138 need not be always provided and that digital data may be directly input to the calculating circuit 128. Further, the semiconductor module need not be clearly separated into the image sensor chip 32 and the signal processing chip 33 as shown in FIG. 14. For example, the interface between the image sensor chip 32 and the signal processing chip 33 may be established by the micro bump at the comparator output shown in FIG. 12. The A/D converting circuits 123, 124 may be of other systems, for example, they may be formed by the method described in U.S. Pat. No. 5,801,657, for example. The memories 131 to 138 need not be always formed of DRAMs. Unlike the related-art example 2, if the image sensor chip 32 has an arrangement in which the signal passing the micro bump 126 is converted into a digital value (the above signal need not be always A/D-converted completely), then a high-speed interface can be established and hence picture quality can be prevented from being deteriorated. Also, since the high-speed interface can be established, if the second multiplexer 125 of another stage is provided on the side of the image sensor chip 32 as shown in FIG. 14, then the number of pixels per micro pad can be increased, the micro pad can be increased in size and a density at which the micro pads are located can be decreased.

The embodiment of the present invention is not limited to the above-mentioned examples and it can take various examples.

Figure 15:
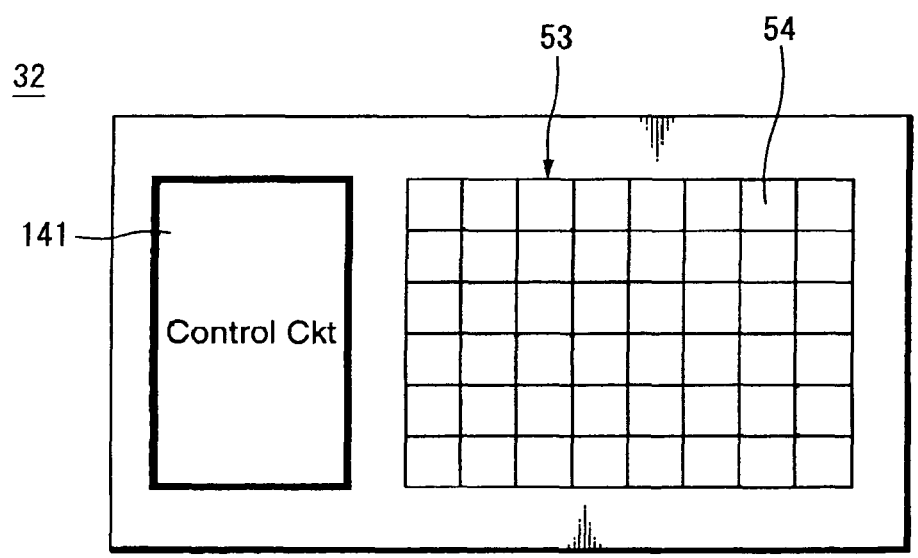
FIG. 15 is a schematic diagram showing a MOS type image sensor chip according to another embodiment of the present invention.

For example, the MOS type image sensor chip 32 is not limited to the arrangement shown in FIG. 6 and it can take an arrangement shown in FIG. 15. That is, as shown in FIG. 15, a pixel control circuit 141 may be provided on the side of the image sensor chip 32 so that the micro pads 37 of the pixel driving portion 55 shown in FIG. 6 can be decreased with a priority.

Various types of A/D conversions such as a method of counting a time period during which a photodiode reaches a certain electrical potential (Dig. Tech. Papers, ISSCC, pp. 230-231) are available in response to respective purposes.

While the source of the amplifying transistor 64 is directly connected to the output line (or output terminal) 72 in FIG. 7, the source of the amplifying transistor 64 can be indirectly connected to the output line (or output terminal) 72 through a normally ON-state transistor, for example, or through other means. Similarly, while the drain of the injection transistor 70 is directly connected to the output line (or output terminal) 72, the source of the injection transistor 70 can be indirectly connected to the output line (or output terminal) 72 through a normally ON-state transistor, for example, or through other means. Similarly, while the drain of the amplifying transistor 64 and the source of the activation transistor 68 are directly connected and the activation transistor 68 and the power supply wiring 65 are directly connected as described above, respectively, they can be indirectly connected through a normally ON-state transistor, for example, or through other means.

While the source of the amplifying transistor 64 is directly connected to the output line 72 in FIG. 9, the source of the amplifying transistor 64 can be indirectly connected to the output line (or output terminal) 72 through a normally ON-state transistor, for example, or through other means. Similarly, the drain of the load transistor 152 and the output line (or output terminal) 72 and the amplifying transistor 64 and the power supply wiring 65 can be directly connected respectively, they can be indirectly connected through a normally ON-state transistor, for example, or through other means.

While the drain of the transfer transistor 61 is directly connected to the gate of the amplifying transistor 64 as shown in FIGS. 7 and 9, the present invention is not limited thereto and the drain of the transfer transistor 61 can be indirectly connected to the gate of the amplifying transistor 64 through a normally ON-state transistor, for example, or through other means.

According to the above-mentioned embodiments, since the MOS image sensor 32 and the signal processing chip 33 are connected together by the micro bumps 36 and 39, the high-speed interface becomes possible. Further, simultaneity within the picture also can be realized. Furthermore, since the semiconductor module includes the back-illuminated type MOS image sensor chip, a large number of micro pads 36 and 39 can be formed on the wiring layer on the side opposite to the light incident surface (or the surface of the supporting substrate if the MOS image sensor chip includes the supporting substrate).

Since the MOS image sensor chip is formed as the back-illuminated type MOS image sensor chip and the image sensor chip 32 and the signal processing chip 33 are connected together on the wiring sides through the micro bumps 36 and 39, the through-hole forming process may becomes needless unlike the related-art example 2 and hence the number of processes can be decreased. As a consequence, a manufacturing process can be facilitated and a yield can be improved. Also, since the photosensitive area may be prevented from being decreased by the circuits and the through-hole spaces, sensitivity can be improved and asymmetry relative to skewed light can be prevented.

According to the cell arrangement shown in FIG. 7, since the activation transistor 68 and the injection transistor 70 are located within the cell and the activation transistor 68 and the injection transistor 70 are operated so as not to be turned ON at the same time, even when all pixels or a large number of pixels are driven at the same time and pixel signals are read out at the same time, a large electric current can be prevented from flowing and hence reliability as a solid-state image pickup device can be improved.

In the present invention, the MOS type solid-state image pickup device including the aforementioned cell 54 shown in FIG. 7 can be constructed independently. In this case, the present invention can be applied to any of the back-illuminated type MOS solid-state image pickup device and the front-illuminated type MOS solid-state image pickup device. Further, with respect to a connection method for connecting the image sensor chip to the signal processing chip, the image sensor chip and the signal processing chip can be connected by using any of the connection based on the micro bump or other suitable connection means.

According to the above-mentioned MOS type solid-state image pickup device, all pixels or a large number of pixels are driven at the same time and hence pixel signals can be read out at the same time. Further, since the cell includes the activation transistor and the injection transistor and the two transistors are prevented from being turned ON at the same time so that a constant electric current can be prevented from flowing, when the MOS type solid-state image pickup device includes cells of the 1,000,000 order and all pixels or a large number of pixels are driven at the same time to read out pixel signal at the same time, a large electric current can be prevented from flowing and hence the MOS type solid-state image pickup device can be improved in reliability.

Further, since the reset pulse supplied to the reset mechanism overlaps with the first injection pulse supplied to the injection transistor and the reset pulse falls before the first injection pulse falls, the output line electrical potential obtained immediately after the reset pulse can be made equal to the ground electrical potential and hence the output line electrical potential can be prevented from being fluctuated.

Furthermore, since the cell includes the transfer transistor and the transfer pulse supplied to the transfer transistor falls before the second injection pulse supplied to the injection transistor rises, the voltage can be decreased. That is, since the floating diffusion (FD) electrical potential obtained upon transfer is high owing to the effect of the capacity coupling within the pixel as compared with the case in which the transfer pulse overlaps with the second injection pulse, the voltage can be decreased.

According to the embodiment of the semiconductor module of the present invention, since this semiconductor module includes a back-illuminated type MOS solid-state image pickup device in which micro pads are formed on a wiring layer side at every unit pixel cell or at every cell of a plurality of pixels and a signal processing chip in which micro pads are formed on a wiring layer side at positions corresponding to the micro pads of the MOS type solid-state image pickup device, wherein the MOS type solid-state image pickup device and the signal processing chip are connected by micro bumps, an image processing speed can be increased and therefore a high-speed interface becomes possible. Also, since all pixels or a large number of pixels can be driven at the same time and pixel signals can be read out at the same time, simultaneity within the picture can be obtained. Accordingly, it is possible to obtain excellent picture quality.

Since the semiconductor module employs the back-illuminated MOS type solid-state image pickup device in which the micro pads are formed on the wiring layer side at its surface opposite to the light incident surface, a large number of micro pads can be arrayed on the surface without consciousness of the aperture ratio of the image sensor.

Only the pixels and the wirings may be formed on the side of the MOS type solid-state image pickup device and all of other circuit systems than the pixels and the wiring are formed on the side of the signal processing chip. With this arrangement, it is possible to decrease the costs of both the MOS type solid-state image pickup device and the signal processing chip.

Since the MOS type solid-state image pickup device is formed as a back-illuminated MOS type solid-state image pickup device and the solid-state image pickup device and the signal processing chip are connected at the wiring layer sides through the micro pads and the micro bumps, a related-art through-hole forming process is not required and hence the number of processes can be decreased. Thus, a manufacturing process can be facilitated and a yield can be increased. As a result, since the photosensitive region is not decreased with the space to prepare the through-holes, sensitivity of the MOS type solid-state image pickup device can be improved and hence asymmetry against skewed light can be prevented.

The so-called pixel driving micro pads such as those for use as a power supply, a ground and a pixel control signal are formed on the MOS type solid-state image pickup device at its region corresponding to the periphery of the pixel region portion and the micro pads can be connected to the micro pad of the signal processing chip side through the micro bumps. Hence, an inductance and a capacity component between the connected portions can be decreased and disturbance and delay of a signal can be avoided.

Since the external interface is established only through the ordinary pad of the signal processing chip, that is, the external interface is not established from the MOS type solid-state image pickup device side, an optically useless area on the MOS type solid-state image pickup device side can be omitted and hence it is possible to avoid the decrease in the ratio at which the pixel areas are occupied by the circuit system.

Since the MOS type solid-state image pickup device includes the ordinary pad for testing, characteristics of the MOS type solid-state image pickup device can be inspected before it is bonded to the signal processing chip.

Since the MOS type solid-state image pickup device has a cell including: a photoelectric-converting element, an amplifying transistor including the gate to receive signal electrical charges from the photoelectric-converting element, an output line directly or indirectly connected to the source of the amplifying transistor so as to be connected to the micro pads, a load transistor of which drain is directly or indirectly connected to the output line, a wiring connected to the source of the load transistor to supply a first voltage, a reset mechanism for resetting a gate potential of the amplifying transistor and a wiring directly or indirectly connected to the drain of the amplifying transistor to supply a second voltage, the MOS type solid-state image pickup device and the signal processing chip can be connected through the above-mentioned micro bumps, all pixels or a large number of pixels can be driven at the same time and pixels signals can be read out at the same time.

Since the MOS type solid-state image pickup device has a cell including a photoelectric-converting element, an amplifying transistor including the gate to receive signal electrical charges from the photoelectric-converting element, an output line directly or indirectly connected to the source of the amplifying transistor, an injection transistor of which drain is directly or indirectly connected to the output line, a wiring connected to the source of the injection transistor to supply a first voltage, a reset mechanism for resetting a gate potential of the amplifying transistor, an activation transistor of which source is directly or indirectly connected to the drain of the amplifying transistor and a wiring directly or indirectly connected to the drain of the activation transistor to supply a second voltage, the MOS type solid-state image pickup device and the signal processing chip can be connected through the above-mentioned micro bumps, all pixels or a large number of pixels can be driven at the same time and pixels signals can be read out at the same time. Further, the cell includes the activation transistor and the injection transistor and both of the activation transistor and the injection transistor can be prevented from being turned on at the same time so that a constant electric current can be prevented from flowing and the MOS type solid-state image pickup device includes the cells of the order of 1,000,000. Thus, when all pixels or a large number of pixels can be driven at the same time and pixels signals can be read out at the same time, a large electric current can be prevented from flowing and hence a problem of an electric current can be solved.

Since the reset mechanism is supplied with a reset pulse, the reset pulse overlapping with a first injection pulse supplied to the injection transistor and the reset pulse being ended before the end of the first injection pulse, the output line electrical potential obtained immediately after the reset pulse can be made equal to the ground electrical potential and hence the output line electrical potential can be prevented from being fluctuated.

Since the cell includes the transfer transistor and the transfer pulse supplied to the transfer transistor is ended before the second injection pulse supplied to the injection transistor is started, the voltage can be lowered. That is, as compared with the case in which the transfer pulse overlaps with the second injection pulse, the electrical potential obtained from the floating diffusion (FD) upon transfer is high owing to the effectiveness of the capacity coupling within the pixel so that the voltage can be lowered.

Since the MOS type solid-state image pickup device outputs a cell output which is a multiplexed analog signal, the analog signal is digitized by the signal processing chip, demultiplexed and stored in the memory, the MOS type solid-state image pickup device may not require a signal processing circuit to process a signal obtained after the cell output was converted into the analog signal and a yield in the manufacturing process of the MOS type solid-state image pickup device can be increased.

Since the cell output from the MOS type solid-state image pickup device is converted into the digital signal and this digital signal is demultiplexed and stored in the memory on the signal processing chip side, a plurality of pixels can be collected as one cell and digital signals corresponding to those pixels can be collected at the unit of a plurality of cells and can be output to the signal processing chip side through one micro pad. Accordingly, the number of pixels per micro pad can be increased, the micro pad can be increased in size and it can also be decreased in density.

In general, the MOS type solid-state image pickup device in which pixel characteristics are difficult to become uniform is low in yield as compared with the signal processing chip. According to the embodiments of the present invention, since the MOS type solid-state image pickup device side does not include a control circuit, that is, it has an arrangement in which other circuits than the pixels can be decreased as much as possible, the useless area can be decreased and a cost of the system including the MOS type solid-state image pickup device and the signal processing chip can be decreased.

According to the embodiment of the MOS type solid-state image pickup device of the present invention, since the MOS type solid-state image pickup device includes a unit pixel cell or a cell having a plurality of pixels: including a photoelectric-converting element, an amplifying transistor including the gate to receive signal electrical charges from the photoelectric-converting element, an output line directly or indirectly connected to the source of the amplifying transistor, an injection transistor of which drains is directly or indirectly connected to the output line, a wiring connected to the source of the injection transistor to supply a first voltage, a reset mechanism for resetting a gate potential of the amplifying transistor, an activation transistor of which source is directly or indirectly connected to the drain of the amplifying transistor and a wiring directly or indirectly connected to the drain of the activation transistor to supply a second voltage, all pixels or a large number of pixels can be driven at the same time and pixel signals can be read out at the same time. Further, the cell includes the activation transistor and the injection transistor and both of the activation transistor and the injection transistor can be prevented from being turned on at the same time so that a constant electric current can be prevented from flowing and the MOS type solid-state image pickup device includes the cells of the order of 1,000,000. Thus, when all pixels or a large number of pixels can be driven at the same time and pixels signals can be read out at the same time, a large electric current can be prevented from flowing and hence a problem of an electric current can be solved.

In the above-described MOS type solid-state image pickup device, since the reset mechanism is supplied with a reset pulse, the reset pulse overlapping with a first injection pulse supplied to the injection transistor and the reset pulse being ended before the end of the first injection pulse, the output line electrical potential obtained immediately after the reset pulse can be made equal to the ground electrical potential and hence the output line electrical potential can be prevented from being fluctuated.

In the above-described MOS type solid-state image pickup device, since the cell includes the transfer transistor and the transfer pulse supplied to the transfer transistor is ended before the second injection pulse supplied to the injection transistor is started, the voltage can be lowered. That is, as compared with the case in which the transfer pulse overlaps with the second injection pulse, the electrical potential obtained from the floating diffusion (FD) upon transfer is high owing to the effectiveness of the capacity coupling within the pixel so that the voltage can be lowered.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor module comprising:
a back-illuminated type MOS (metal-oxide semiconductor) solid state image sensor chip comprising a substrate having a back surface via which light is received;
a wiring layer on a surface of the substrate opposite to the back surface;
a first plurality of micro pads on the wiring layer;
a signal processing chip adjacent to the wiring layer; and
a second plurality of micro pads on the signal processing chip,
wherein,
the substrate includes at least one photo electric conversion element,
each one of said first plurality of micro pads is electrically connected to a corresponding one of the second plurality of micro pads via one of a plurality of micro bumps,
a third plurality of micro pads are on a region corresponding to a periphery of the image sensor chip and outside a region of the at least one photo electric conversion element, and
the third plurality of micro pads are connected to some of the second plurality of micro pads on the signal processing chip through some of the plurality of micro bumps and are configured to receive signals for driving the at least one photo electric conversion element.

2. A semiconductor module according to claim 1, wherein the one of a plurality of micro bumps is shared by a plurality of pixels of said image sensor chip.

3. A semiconductor module according to claim 1, wherein a plurality of ordinary pads are located on a periphery of said signal processing chip.

4. A semiconductor module according to claim 3, wherein said image sensor chip includes ordinary test pads.

5. A semiconductor module according to claim 1, wherein said MOS solid-state image pickup device has a cell including:
a photoelectric-converting element;
an amplifying transistor including the gate to receive signal electrical charges from said photoelectric-converting element;
an output line directly or indirectly connected to the source of said amplifying transistor so as to be connected to said micro pads;
a load transistor of which drain is directly or indirectly connected to said output line;
a wiring connected to the source of said load transistor to supply a first voltage;
a reset mechanism for resetting a gate potential of said amplifying transistor; and
a wiring directly or indirectly connected to the drain of said amplifying transistor to supply a second voltage.

6. A semiconductor module according to claim 1, wherein said image sensor chip further comprises:
an amplifying transistor including a gate to receive signal electrical charges from said photoelectric-converting element;
an output line directly or indirectly connected to the source of said amplifying transistor;
an injection transistor with a drain directly or indirectly connected to said output line;
a wiring connected to the source of said injection transistor to supply a first voltage;
a reset mechanism for resetting a gate potential of said amplifying transistor;
an activation transistor with a source directly or indirectly connected to the drain of said amplifying transistor; and
a wiring directly or indirectly connected to the drain of said activation transistor to supply a second voltage.

7. A semiconductor module according to claim 6, wherein said reset mechanism is supplied with a reset pulse, said reset pulse overlapping with a first injection pulse supplied to said injection transistor and said reset pulse being ended before the end of said first injection pulse.

8. A semiconductor module according to claim 6, wherein:
said image sensor chip further includes a transfer transistor with a source connected to said photoelectric-converting element and with a drain directly or indirectly connected to the gate of said amplifying transistor, and subsequent to a first injection pulse, a transfer pulse is supplied to said transfer transistor and ended before the start of a second injection pulse supplied to said injection transistor.

9. A semiconductor module according to claim 1, wherein:
said image sensor chip outputs a multiplexed analog signal, and
said analog signal is multiplexed and stored in a memory after digitized by said signal processing chip.

10. A semiconductor module according to claim 1, wherein said image sensor chip performs analog-digital conversion on an output of the at least one photo electric conversion element and outputs a resulting digital signal to the signal processing chip via a corresponding micro bump, and wherein said resulting digital signal is an output which results from further multiplexing a pixel signal after said pixel signal was analog-to-digital converted.

11. A semiconductor module according to claim 1, wherein said image sensor chip does not include a control circuit.

12. A semiconductor module according to claim 1, wherein said resulting digital signal is passed through a multiplexer in said image sensor chip.

13. A semiconductor module according to claim 1, wherein the sensor chip performs analog-digital conversion on an output of a first multiplexer, said multiplexer performing multiplexing on a plurality of photo electric conversion elements.

14. A semiconductor module according to claim 1, wherein at least one the plurality of micro bumps is sealed by a sealing member.

15. A camera comprising a semiconductor module, said semiconductor module comprising:
a back-illuminated type MOS (metal-oxide semiconductor) solid state image sensor chip comprising a substrate having a back surface via which light is received;
a wiring layer on a surface of the substrate opposite to the back surface;
a first plurality of micro pads on the wiring layer;
a signal processing chip adjacent to the wiring layer; and
a second plurality of micro pads on the signal processing chip,
wherein,
the substrate includes at least one photo electric conversion element,
each one of said first plurality of micro pads is electrically connected to a corresponding one of the second plurality of micro pads via one of a plurality of micro bumps,
a third plurality of micro pads are on a region corresponding to a periphery of the image sensor chip and outside a region of the at least one photo electric conversion element, and
the third plurality of micro pads are connected to some of the second plurality of micro pads on the signal processing chip through some of the plurality of micro bumps and are configured to receive signals for driving the at least one photo electric conversion element.

16. A camera according to claim 15, wherein the one of a plurality of micro bumps is shared by a plurality of pixels of said image sensor chip.

17. A camera according to claim 15, wherein a plurality of ordinary pads are located on a periphery of said signal processing chip.

18. A camera according to claim 15, wherein said MOS solid-state image sensor chip has a cell including: a photoelectric-converting element; an amplifying transistor including the gate to receive signal electrical charges from said photoelectric-converting element; an output line directly or indirectly connected to the source of said amplifying transistor so as to be connected to said micro pads; a load transistor of which drain is directly or indirectly connected to said output line; a wiring connected to the source of said load transistor to supply a first voltage; a reset mechanism for resetting a gate potential of said amplifying transistor; and a wiring directly or indirectly connected to the drain of said amplifying transistor to supply a second voltage.

19. A manufacturing method of camera comprising the steps of:
forming a back-illuminated type MOS solid state image sensor chip comprising a substrate having a back surface via which light is received;
forming a wiring layer on a surface of the substrate opposite to the back surface;
forming a first plurality of micro pads on the wiring layer;
placing a signal processing chip adjacent to the wiring layer;
forming a second plurality of micro pads on the signal processing chip; and
electrically connecting each one of said first plurality of micro pads to corresponding one of said second plurality of micro pads via one of a plurality of micro bumps,
wherein,
the substrate includes at least one photo electric conversion element,
a third plurality of micro pads are on a region corresponding to a periphery of the image sensor chip and outside a region of the at least one photo electric conversion element, and
the third plurality of micro pads are connected to some of the second plurality of micro pads on the signal processing chip through some of the plurality of micro bumps and are configured to receive signals for driving the at least one photo electric conversion element.

20. A manufacturing method according to claim 19, wherein the one of a plurality of micro bumps is shared by a plurality of pixels of said image sensor chip.

* * * * *